(12) United States Patent
Won et al.

(10) Patent No.: US 9,753,590 B2
(45) Date of Patent: Sep. 5, 2017

(54) DISPLAY DEVICE INTEGRATED WITH TOUCH SCREEN PANEL AND METHOD OF FABRICATING THE SAME

(71) Applicant: LG DISPLAY CO., LTD., Seoul (KR)

(72) Inventors: Sanghyuk Won, Goyang-si (KR); MinJoo Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 49 days.

(21) Appl. No.: 14/576,733

(22) Filed: Dec. 19, 2014

(65) Prior Publication Data
US 2015/0364507 A1    Dec. 17, 2015

(30) Foreign Application Priority Data

Jun. 13, 2014 (KR) .................. 10-2014-0071951
Nov. 5, 2014 (KR) .................. 10-2014-0152574

(51) Int. Cl.
| | |
|---|---|
| *H01L 29/10* | (2006.01) |
| *H01L 29/12* | (2006.01) |
| *G06F 3/044* | (2006.01) |
| *G06F 3/041* | (2006.01) |
| *H01L 27/12* | (2006.01) |

(52) U.S. Cl.
CPC ............ *G06F 3/044* (2013.01); *G06F 3/0412* (2013.01); *G06F 2203/04103* (2013.01); *H01L 27/124* (2013.01); *H01L 27/1225* (2013.01)

(58) Field of Classification Search
CPC ............... H01L 27/1225; H01L 27/124; H01L 27/1214; G06F 3/0142; G06F 3/044; G06F 3/047
See application file for complete search history.

(56) References Cited

U.S. PATENT DOCUMENTS

| | | | | |
|---|---|---|---|---|
| 2010/0214260 A1* | 8/2010 | Tanaka | ................ | G02F 1/13338 345/174 |
| 2013/0257774 A1* | 10/2013 | Kim | .................... | H01L 27/1259 345/173 |
| 2014/0333571 A1* | 11/2014 | Hu | ....................... | G06F 3/0412 345/174 |

FOREIGN PATENT DOCUMENTS

| KR | 10-2012-0119368 A | 10/2012 |
|---|---|---|
| KR | 10-2012-0119369 A | 10/2012 |
| KR | 10-2014-0041154 A | 4/2014 |

* cited by examiner

*Primary Examiner* — Jesse Y Miyoshi
(74) *Attorney, Agent, or Firm* — Dentons US LLP

(57) ABSTRACT

Disclosed is a display device that may, for example, include a gate line that is provided in a first direction on a backplane and delivers a gate signal; a data line that is provided in a second direction on the backplane and delivers a data signal; a Thin Film Transistor (TFT) in each pixel defined by a crossing between the gate line and the data line; a first electrode spaced apart from one of a source electrode and a drain electrode of the TFT; a second electrode that is provided on a layer different from that on which the first electrode is provided; a TFT passivation layer that is provided on the TFT and has a first contact hole; a first connection pattern that connects one of the source electrode and the drain electrode to the first electrode through the first contact hole; and a second connection pattern that delivers a touch driving signal to the second electrode and is formed of a material substantially identical to that of the first connection pattern.

16 Claims, 34 Drawing Sheets

FIG. 19
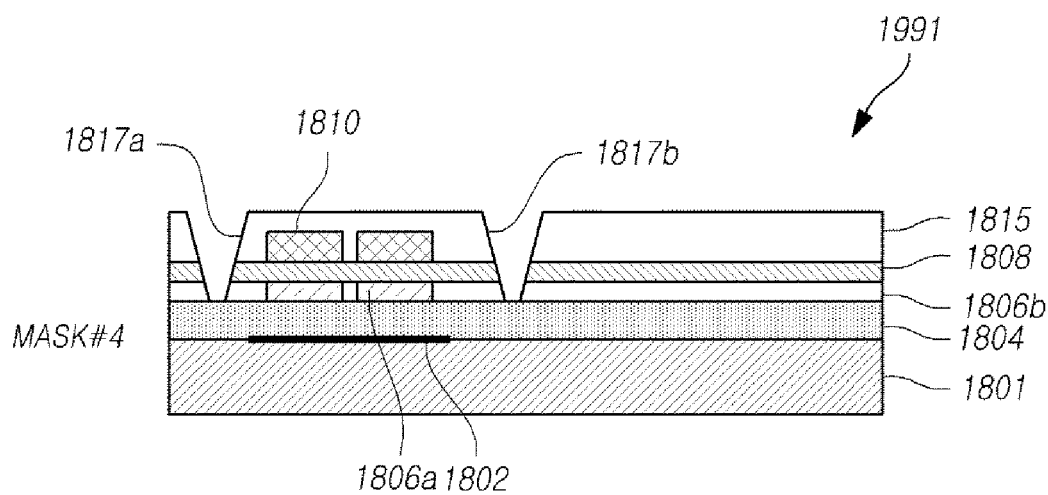
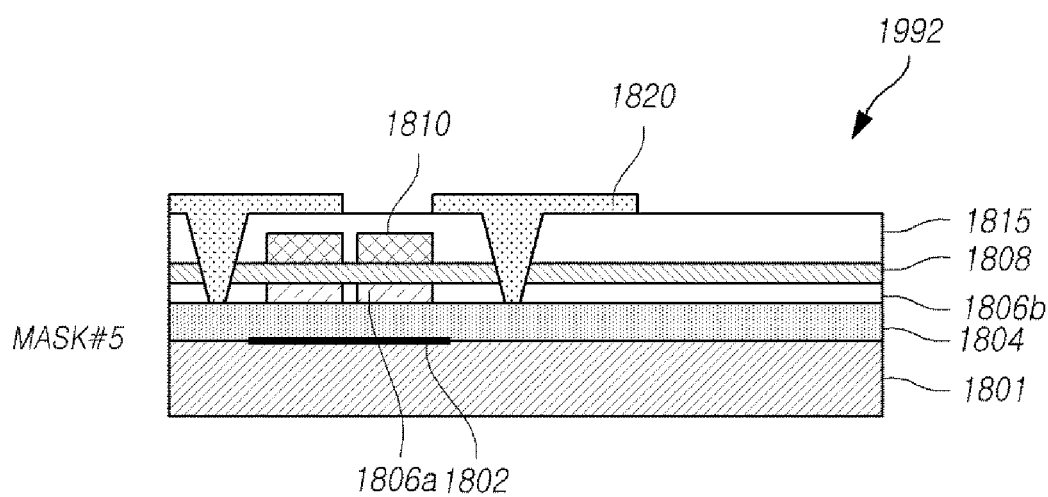

DISPLAY DEVICE INTEGRATED WITH TOUCH SCREEN PANEL AND METHOD OF FABRICATING THE SAME

CROSS-REFERENCE TO RELATED APPLICATIONS

This application claims the benefit of the Korean Patent Application Nos. 10-2014-0071951 and 10-2014-0152574, filed on Jun. 13, 2014 and on Nov. 5, 2014, respectively, which are hereby incorporated by reference for all purposes as if fully set forth herein.

BACKGROUND OF THE INVENTION

Field of the Invention

The present invention relates to a display device integrated with a touch screen panel and a method of fabricating the same.

Discussion of the Related Art

With the progress of information-oriented society, demands for display devices for displaying images have increased in various forms. Recently, various display devices, such as a Liquid Crystal Display (LCD), a Plasma Display Panel (PDP), an Organic Light Emitting Diode Display (OLED) device, etc., have been utilized.

Such a display device provides a touch-based input scheme where a user is able to input information or a command easily, intuitively and conveniently, which is different from a conventional input scheme in which a button, a keyboard, a mouse, and the like are used.

Such a touch-based input scheme typically needs to recognize a touch by the user and accurately detect the touch coordinates. To this end, various touch schemes have been employed, such as a resistive scheme, a capacitive scheme, an electromagnetic induction scheme, an infrared scheme, and an ultrasonic scheme, and the like.

Also, there has been an effort to incorporate a touch sensor within the display device. Particularly, an in-cell type display device has been developed in which a common electrode on a lower substrate is utilized as a touch sensing electrode.

In this regard, such an in-cell type display device may require a specific process to form a touch sensing electrode within the display device. Moreover, the in-cell type display device may require high manufacturing cost and longer manufacturing time, thus reducing competitiveness of the product.

SUMMARY OF THE INVENTION

Accordingly, the present invention is directed to provide a display device integrated with a touch screen panel and method of manufacturing the same that substantially obviates one or more problems due to limitations and disadvantages of the related art.

An advantage of the present invention is to provide a display device integrated with a touch screen panel that can be manufactured with a reduced number of mask steps.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a gate line that is provided in a first direction on a backplane and delivers a gate signal; a data line that is provided in a second direction on the backplane and delivers a data signal; a Thin Film Transistor (TFT) in each pixel defined by a crossing between the gate line and the data line; a first electrode spaced apart from one of a source electrode and a drain electrode of the TFT; a second electrode that is provided on a layer different from that on which the first electrode is provided; a TFT passivation layer that is provided on the TFT and has a first contact hole; a first connection pattern that connects one of the source electrode and the drain electrode to the first electrode through the first contact hole; and a second connection pattern that delivers a touch driving signal to the second electrode and is formed of a material substantially identical to that of the first connection pattern.

In accordance with another aspect of the present invention, a display device may, for example, include a display panel including: a Thin Film Transistor (TFT) that is provided in each of an N×P number of pixels defined by crossings between gate lines that are provided in a first direction on a backplane and deliver gate signals, and data lines that are provided in a second direction on the backplane and deliver data signals, an N×P number of first electrodes, each of which is provided so as to be spaced apart from one of a source electrode and a drain electrode of the TFT, the P number of second electrodes, each of which is provided so as to correspond to the first electrode and which provide an identical signal to all of the N number of pixels, a TFT passivation layer that is provided on the TFT and has a first contact hole; the N×P number of first connection patterns which are provided on the N×P number of TFTs and each of which connects the first electrode to one of the source electrode or the drain electrode through the first contact hole, and the P number of second connection patterns that deliver a touch driving signal to the P number of second electrodes and are formed of a material substantially identical to that of the first connection patterns; a touch integrated circuit that applies a touch driving signal to all or some of the P number of second electrodes when a driving mode of the display panel is a touch driving mode; a data driver that supplies data voltages to the data lines when the driving mode is a display driving mode; and a gate driver that sequentially supplies scan signals to the gate lines when the driving mode is the display driving mode.

In accordance with still another aspect of the present invention, a method of fabricating a display device having a touch sensor may, for example, include forming a Thin Film Transistor (TFT) on a backplane; forming a TFT passivation layer that covers the TFT, and a first electrode layer; forming a first electrode by etching the first electrode layer and the TFT passivation layer by using a first photomask; forming a first connection pattern that connects one of a source electrode or a drain electrode of the TFT to the first electrode, and a second connection pattern that delivers a touch driving signal to a second electrode, by using a second photomask; forming a first electrode passivation layer, and forming the first electrode passivation layer by using a third photomask; and forming the second electrode by using a fourth photomask.

In accordance with yet another aspect of the present invention, a method of fabricating a display device having a touch sensor may, for example, include forming a Thin Film Transistor (TFT) on a backplane; forming an overcoat layer and a common electrode layer on the TFT; forming a common electrode by etching the common electrode layer and the overcoat layer by using a first photomask; forming a first passivation layer on the overcoat layer and the common electrode; forming a touch signal line on the first passivation layer by using a second photomask; forming a second passivation layer on the touch signal line and the first passivation layer; forming a first contact hole that exposes one of a source electrode and a drain electrode of the TFT, a second contact hole that exposes the common electrode, and a third contact hole that exposes the touch signal line, by etching the first passivation layer, the second passivation layer and the overcoat layer by using a third photomask; and forming a pixel electrode on the second passivation layer by using a fourth photomask, and simultaneously, forming a first connection pattern on the first contact hole and forming a second connection pattern on the second contact hole and the third contact hole, by using a material substantially identical to that of the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 19 is cross-sectional views illustrating a process of forming a source electrode and a drain electrode according to an embodiment of the present invention;

DETAILED DESCRIPTION OF THE ILLUSTRATED EMBODIMENTS

Reference will now be made in detail to embodiments of the present invention, examples of which are illustrated in the accompanying drawings. In the following description, the same reference numbers may be used throughout the drawings to refer to the same or like parts, and a detailed description of known functions and configurations incorporated herein may be omitted.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element(s) may "be connected to", "be coupled to", or "be in contact with" the structural elements as well as that the certain structural element is directly connected to or is in direct contact with another structural element(s).

An embodiment according to the present invention is to provide a process method that uses a metal material to form a touch signal line in order to allow a pixel electrode to be connected (or come into contact) with a source electrode or a drain electrode, and a display device including a structure of a connection pattern which allows a source electrode or a drain electrode to be connected to a pixel electrode.

Figure 1:
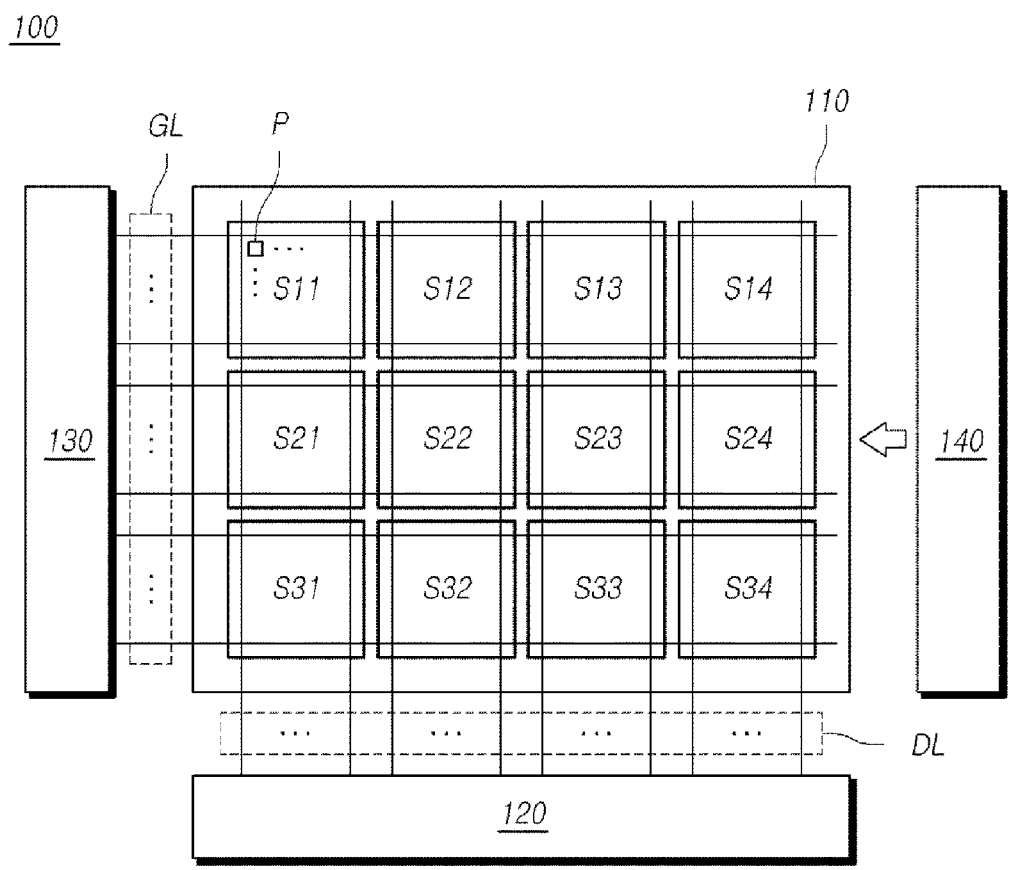
FIG. 1 is a plan view schematically illustrating an example of a display device integrated with a touch screen panel.

FIG. 1 is a plan view schematically illustrating an example of a display device integrated with a touch screen panel.

Referring to FIG. 1, the display device 100 integrated with the touch screen panel includes a panel 110, a data driver 120, a gate driver 130 and an integrated circuit 140 for controlling a touch signal (hereinafter, referred to as a "touch integrated circuit").

In the panel 110, multiple gate lines GL are formed in a first direction (e.g., a horizontal direction or a vertical direction), multiple data lines DL are formed in a second direction (e.g., the vertical direction or horizontal direction), and multiple corresponding pixels Ps are defined at each of crossings between the multiple data lines DL and the multiple gate lines GL.

At a pixel region of each pixel P, a source electrode or a drain electrode is connected to a data line DL, a gate electrode is connected to a gate line GL, and either of the drain electrode and the source electrode is connected to a pixel electrode (or a first electrode).

Also, in the panel 110, multiple electrodes S11 to S14, S21 to S24 and S31 to S34, which are grouped or blocked into multiple electrode groups, are further formed so as to be spaced apart from each other.

The panel 110 serves as a display panel as well as a touch screen panel (TSP).

Specifically, the panel 110 may be a panel into which a display panel and a TSP are integrated, or may be configured in an in-cell type touch screen in which the TSP is built into a cell of the display panel.

When the panel 110 serves as a display panel, a driving mode of the panel 110 is referred to as a "display driving mode." When the panel 110 serves as a TSP, a driving mode of the panel 110 is referred to as a "touch driving mode."

When the panel 110 is in the display driving mode, the data driver 120 supplies a data voltage Vdata or data signal to the multiple data lines DL and the gate driver 130 sequentially supplies a gate signal or scan signal to the multiple gate lines GL in order to display an image.

When the panel 110 is in the touch driving mode, the touch integrated circuit 140 applies a touch driving signal to all or some of the multiple electrodes S11 to S14, S21 to S24 and S31 to S34 that are directly connected through touch signal lines. Here, the touch driving signal is also referred to as a "touch sensing signal," "touch sensing voltage," or "touch driving voltage Vtd." For example, when the panel 110 is the touch driving mode, the touch integrated circuit 140 applies a touch driving signal to all or some of multiple electrode groups S11 to S14, S21 to S24 and S31 to S34.

Meanwhile, the display device 100 integrated with the touch screen panel may further include a timing controller (not illustrated) that controls a driving timing of each of the data driver 120 and the gate driver 130.

Also, the display device 100 integrated with the touch screen panel may further include a touch controller (not illustrated) that detects whether there is a touch by a user, touch coordinates, and the like after receiving sensing data (e.g., a capacitance, a variance in capacitance, a voltage, etc.) measured by the touch integrated circuit 140 through the multiple electrodes S11 to S14, S21 to S24 and S31 to S34 that serve as touch electrodes.

Meanwhile, the panel 110 of the display device 100 integrated with the touch screen panel is driven while repeating the display driving mode and the touch driving mode. A timing of the display driving mode and the touch driving mode may be controlled by a control signal output from the timing controller, the touch controller, or the like. In some cases, the timing of the display driving mode and the touch driving mode may be controlled by the timing controller and the touch controller which operate in cooperation with each other.

Further, the display device 100 integrated with the touch screen panel is of a capacitance touch scheme where a touch by the user, touch coordinates, and the like are determined on a basis of a change in capacitance through the multiple touch electrodes (e.g., the electrodes in the horizontal direction and the electrodes in the vertical direction) formed in the TSP.

The capacitance touch schemes may be further classified into, for example, a mutual capacitance touch scheme, a self capacitance touch scheme, and the like.

In the mutual capacitance touch scheme, one of the electrode in the horizontal direction and the electrode in the vertical direction becomes a Tx electrode (referred to as a "driving electrode") to which a driving voltage is applied, and the other electrode becomes an Rx electrode (referred to as a "sensing electrode") that senses a change in capacitance by a touch by the user. Accordingly, detection of whether there is a touch by the user with a pointer such as a finger and a pen, touch coordinates, and the like are determined on a basis of a change in capacitance (mutual capacitance) between the Tx electrode and the Rx electrode.

In the self capacitance touch scheme, each touch electrode forms a capacitance (i.e., a self capacitance) between itself and a pointer (e.g., a finger, a pen, etc.), a measurement is made of the capacitance value between each touch electrode and the pointer, and whether there is a touch by the user, touch coordinates, and the like are detected on a basis of the measured capacitance value. In the self capacitance touch scheme, different from the mutual capacitance touch scheme, a driving voltage (a touch driving signal) is applied and simultaneously sensed through each touch electrode. Accordingly, the self capacitance touch scheme does not distinguish a Tx electrode from an Rx electrode.

The display device 100 integrated with the touch screen panel may employ one of the above-described two types of capacitance touch schemes: the mutual capacitance touch scheme and the self capacitance touch scheme. In the following description, the display device 100 integrated with the touch screen panel, which employs the self capacitance touch scheme, will be described as an example for convenience of description.

The data driver 120 may include at least one data driver Integrated Circuit (IC) (also referred to as a "source driver IC"). The at least one data driver IC may be connected with a bonding pad of the panel 110 according to a Tape Automated Bonding (TAB) scheme or a Chip On Glass (COG) scheme, or may be directly formed in the panel 110. In some cases, the at least one data driver IC may be integrated in the panel 110.

The gate driver 130 may be disposed at only one side of the panel 110 as illustrated in FIG. 1, or may be divided into two parts and disposed at both sides of the panel 110, depending driving scheme.

Also, the gate driver 130 may include at least one gate driver IC. The at least one gate driver IC may be connected with a bonding pad of the panel 110 according to the TAB scheme or the COG scheme, or may be implemented in a Gate In Panel (GIP) type and may be directly formed in the panel 110. In some cases, the at least one gate driver IC may be integrated in the panel 110.

The touch Integrated Circuit (IC) 140 may be an separate element different from the data driver 120 and the gate driver 130, as illustrated in FIG. 1, and may be disposed outside the data driver 120 and the gate driver 130. However, the touch IC 140 may be implemented as an internal element of another separate driver IC (e.g., a display driver IC) which may include at least one of the data driver 120 and the gate driver 130 depending on driving scheme. Alternatively, the touch IC 140 may be implemented as an internal element of the data driver 120 or the gate driver 130.

Accordingly, in the touch driving mode, where the touch IC 140 applies a touch driving signal to all or some of the multiple electrodes serving as touch electrodes, a separate driver IC including the touch IC 140 may apply a touch driving signal to all or some of the multiple electrodes serving as the touch electrodes. Such a configuration may be regarded as a case where the data driver 120 or the gate driver 130 including the touch IC 140 applies a touch driving signal to all or some of the multiple electrodes serving as the touch electrodes, depending on design method.

Without limiting implementation and design method, the touch IC 140 may be any element, or an internal or external element, so long as it performs functions identical or similar to those of the touch IC 140 described in this specification. Also, although only one touch IC 140 is illustrated in FIG. 1, two or more touch ICs may be implemented.

Meanwhile, in order to apply a touch driving signal to all or some of the multiple electrodes (e.g., the electrodes S11 to S14, S21 to S24 and S31 to S34), the touch IC 140 may require a configuration in which separate signal lines are respectively connected to the multiple electrodes S11 to S14, S21 to S24 and S31 to S34.

At least one signal line, which is respectively connected to the multiple electrodes S11 to S14, S21 to S24 and S31 to S34 and delivers a touch driving signal or a common voltage thereto, may be formed in a first direction (e.g., the vertical direction) or a second direction (e.g., the horizontal direction) in the panel 110.

When the number of signal lines respectively connected to the multiple electrodes S11 to S14, S21 to S24 and S31 to S34 is equal to or more than 2, resistance can be beneficially reduced.

Meanwhile, a direction for forming the at least one signal line, which is respectively connected to the multiple electrodes S11 to S14, S21 to S24 and S31 to S34, may depend on whether the multiple electrodes S11 to S14, S21 to S24 and S31 to S34 are to be grouped in the first direction (e.g., the vertical direction) of forming the data lines or in the second direction (e.g., the horizontal direction) of forming the gate lines for sensing purposes.

Figure 3:
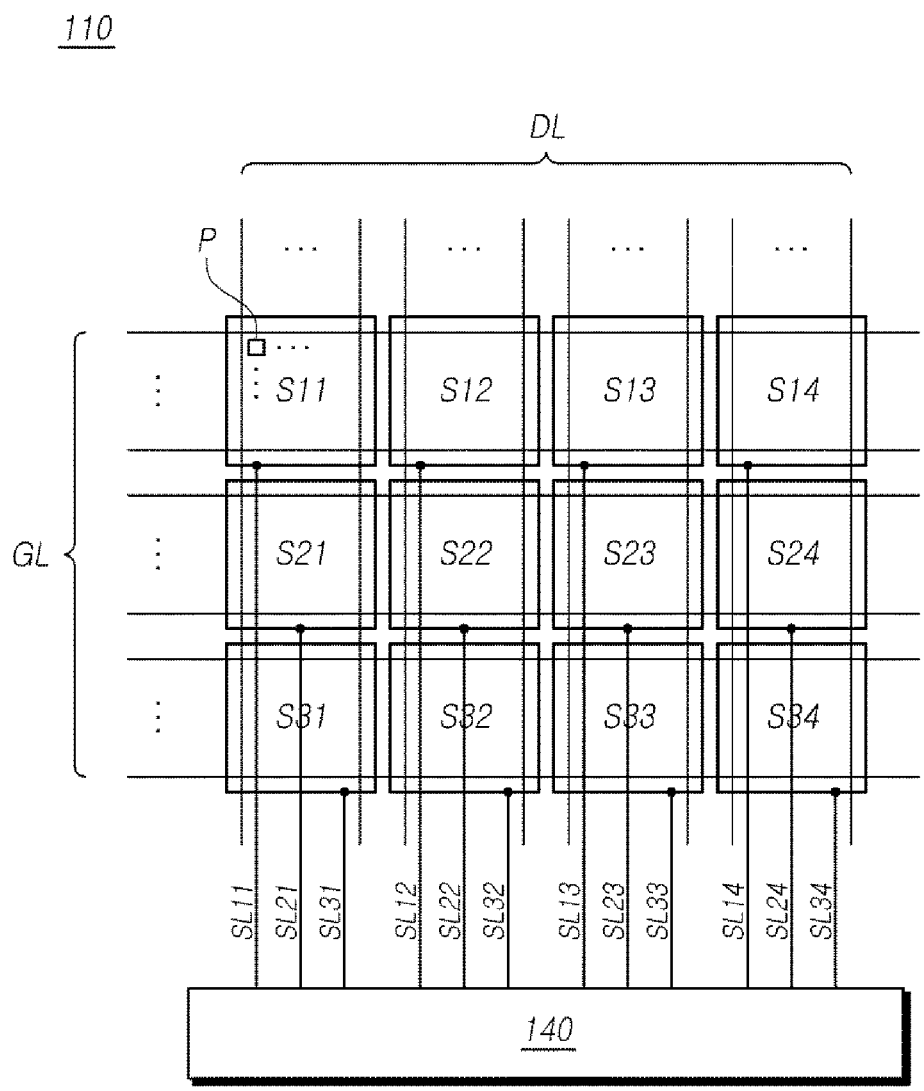
FIG. 3 is a plan view illustrating a panel included in an example of a display device integrated with a touch screen panel.

When the multiple electrodes S11 to S14, S21 to S24 and S31 to S34 are grouped in the first direction (e.g., the vertical direction) of forming the data lines, the at least one signal line, which is respectively connected to the multiple electrodes S11 to S14, S21 to S24 and S31 to S34, may be formed in the first direction for forming the data lines, as illustrated in FIG. 3.

When the multiple electrodes S11 to S14, S21 to S24 and S31 to S34 are grouped in the second direction (e.g., the horizontal direction) of forming the gate lines, the at least one signal line, which is respectively connected to the multiple electrodes S11 to S14, S21 to S24 and S31 to S34, may be formed in the second direction for forming the gate lines.

During the touch driving mode, the multiple electrodes S11 to S14, S21 to S24 and S31 to S34 serve as touch electrodes in which a touch driving signal is applied to all or some of the multiple electrodes, as described above. Also, during the display driving mode, the multiple electrodes S11 to S14, S21 to S24 and S31 to S34 serve as common electrodes to which a common voltage Vcom is applied, with the common electrodes facing pixel electrodes in the panel 110. An electrode that serves as a touch electrode or common electrode according to the driving mode is referred to as a "second electrode."

The display device 100 integrated with the touch screen panel may be, for example, an In-Plane Switching (IPS) type LCD device which arranges liquid crystal molecules horizontally and displays an image by rotating the liquid crystal molecules in a plane direction. The IPS type LCD device has advantages such as high resolution, low power consumption, wide viewing angle, and the like. Also, the display device 100 integrated with the touch screen panel may be an Advanced High Performance-IPS (AH-IPS) LCD device.

During the display driving mode, pixel electrodes and the common pixels S11 to S14, S21 to S24 and S31 to S34 may be formed on the same substrate so as to form a horizontal electric field between the pixel electrodes and the common pixels S11 to S14, S21 to S24 and S31 to S34.

In another example, the display device 100 integrated with the touch screen panel may be an organic light emitting display device having organic light emitting layers formed between pixel electrodes and common electrodes. Here, the pixel electrodes and the common electrodes may be formed on the same substrate.

Figure 2:
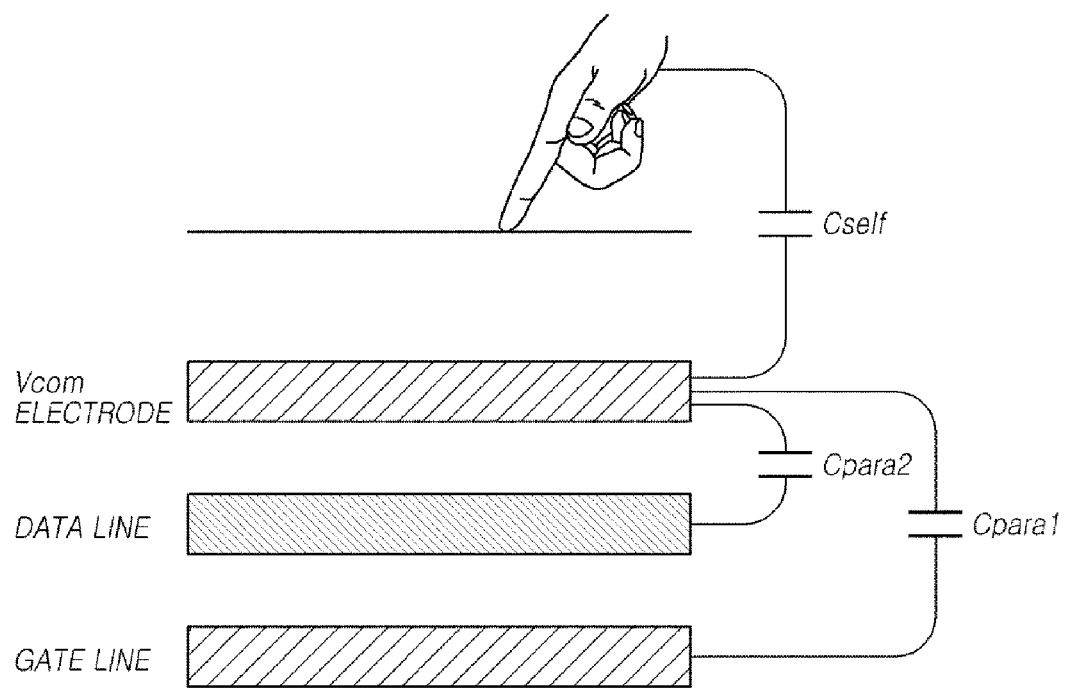
FIG. 2 is a view illustrating Cself, Cpara1 and Cpara2 which are capacitance components generated during a touch driving mode in an example of a display device integrated with a touch screen panel.

FIG. 2 is a view illustrating Cself, Cpara1 and Cpara2 that are capacitance components generated during a touch driving mode in an example of a display device integrated with a touch screen panel.

Referring to FIG. 2, the multiple electrodes S11 to S14, S21 to S24 and S31 to S34 serve as the touch electrodes in the touch driving mode and as the common electrodes forming liquid crystal capacitors between the multiple electrodes and the pixel electrodes in the display driving mode. During the touch driving mode, the multiple electrodes S11 to S14, S21 to S24 and S31 to S34 form a self capacitance Cself with a pointer (e.g., a finger, a pen, etc.) in order to detect whether there is a touch by the user, touch coordinates, and the like. Meanwhile, the multiple electrodes S11 to S14, S21 to S24 and S31 to S34 may also form parasitic capacitances Cpara1 and Cpara2 with the gate lines and data lines, respectively. However, these parasitic capacitances may be much smaller than the self capacitance, and thus can be neglected.

Hereinafter, the panel 110 of the display device 100 integrated with the touch screen panel will be described in more detail with reference to FIGS. 3 to 5, along with various schemes: a scheme for applying a common voltage and a touch driving signal to the multiple electrodes S11 to S14, S21 to S24 and S31 to S34 serving as both the common electrodes and the touch electrodes, a scheme for applying a data voltage and a touch driving signal (or a signal corresponding to the touch driving signal) to the data lines DL, a scheme for applying a data voltage and a touch driving signal (or a signal corresponding to the touch driving signal) to the gate lines GL.

FIG. 3 is a plan view illustrating a panel included in an example of a display device integrated with a touch screen panel.

Referring to FIG. 3, the panel 110 has the multiple data lines DL, the multiple gate lines GL, and the multiple electrodes S11 to S14, S21 to S24 and S31 to S34, as described above.

Also, as described above, the panel 110 may operate in the display driving mode or touch driving mode. In this regard, the multiple data lines DL and the multiple gate lines GL allow the panel 110 to serve as a display panel. In addition, the multiple electrodes S11 to S14, S21 to S24 and S31 to S34 allow the panel 110 to serve as both a display panel and a touch screen panel.

More specifically, when the panel 110 serves as a display panel, namely, when a driving mode of the panel 110 is the display driving mode, a common voltage Vcom is applied to the multiple electrodes S11 to S14, S21 to S24 and S31 to S34, and the multiple electrodes S11 to S14, S21 to S24 and S31 to S34 become common electrodes (or referred to as "Vcom electrodes") which face the pixel electrodes, namely, the first electrodes, (not illustrated).

When the panel 110 serves as a touch screen panel, namely, when a driving mode of the panel 110 is the touch driving mode, a touch driving voltage is applied to the multiple electrodes S11 to S14, S21 to S24 and S31 to S34, and the multiple electrodes S11 to S14, S21 to S24 and S31 to S34 form capacitors between the multiple electrodes and a touch pointer (e.g., a finger, a pen, etc.). The multiple electrodes S11 to S14, S21 to S24 and S31 to S34 become touch electrodes, on which capacitances of the formed capacitors are measured.

In other words, the multiple electrodes S11 to S14, S21 to S24 and S31 to S34 serve as the Vcom electrodes in the display driving mode, and serve as the touch electrodes in the touch driving mode.

The common voltage Vcom is applied to the multiple electrodes S11 to S14, S21 to S24 and S31 to S34 during the display driving mode, and a touch driving signal is applied to the multiple electrodes S11 to S14, S21 to S24 and S31 to S34 during the touch driving mode.

Accordingly, as illustrated in FIG. 3, in order to supply the common voltage Vcom or the touch driving signal to the multiple electrodes S11 to S14, S21 to S24 and S31 to S34, signal lines SL11 to SL14, SL21 to SL24 and SL31 to SL34 may be connected to the multiple electrodes S11 to S14, S21 to S24 and S31 to S34.

During the touch driving mode, a touch driving signal Vtd generated by the touch IC 140 is supplied to all or some of the multiple electrodes S11 to S14, S21 to S24 and S31 to S34 through the signal lines SL11 to SL14, SL21 to SL24 and SL31 to SL34. During the display driving mode, the common voltage Vcom supplied by a common voltage supplier (not illustrated) is applied to the multiple electrodes S11 to S14, S21 to S24 and S31 to S34 through the signal lines SL11 to SL14, SL21 to SL24 and SL31 to SL34.

Referring to FIG. 3, one corresponding pixel P is defined at each crossing between the multiple data lines DL and the multiple gate lines GL formed in the panel 110. Here, each pixel may be one of a Red (R) pixel, a Green (G) pixel and a Blue (B) pixel.

Two or more pixels Ps may be defined in a region (hereinafter also referred to as a "unit touch electrode region") where each of the multiple electrodes S11 to S14, S21 to S24 and S31 to S34 is formed which serve as the common electrodes as well as the touch electrodes. Specifically, one of the multiple electrodes S11 to S14, S21 to S24 and S31 to S34 corresponds to two or more pixels Ps.

For example, 24×3 data lines DL and 24 gate lines GL are disposed in one region (a unit touch electrode region) where each of the multiple electrodes S11 to S14, S21 to S24 and S31 to S34 is formed. Accordingly, 24×3×24 pixels Ps may be defined.

Still referring to FIG. 3, each of the multiple electrodes S11 to S14, S21 to S24 and S31 to S34 that serve as the common electrodes as well as the touch electrodes may have a block-shaped pattern, or may have a pattern including a finger-shaped part according to embodiments of the present invention.

In FIG. 3, the multiple electrodes serving as the common electrodes as well as the touch electrodes are illustrated as being arranged in a 3×4 matrix, with 12 multiple electrodes. However, this configuration is only an example for convenience of description. It should be understood that the size and configuration of each of the display device 100 integrated with the touch screen panel and the panel 110, touch system design standards, and the like may vary depending on applications, and the multiple electrodes serving as the common electrodes as well as the touch electrodes may be formed in various matrices and various numbers thereof.

Figure 4:
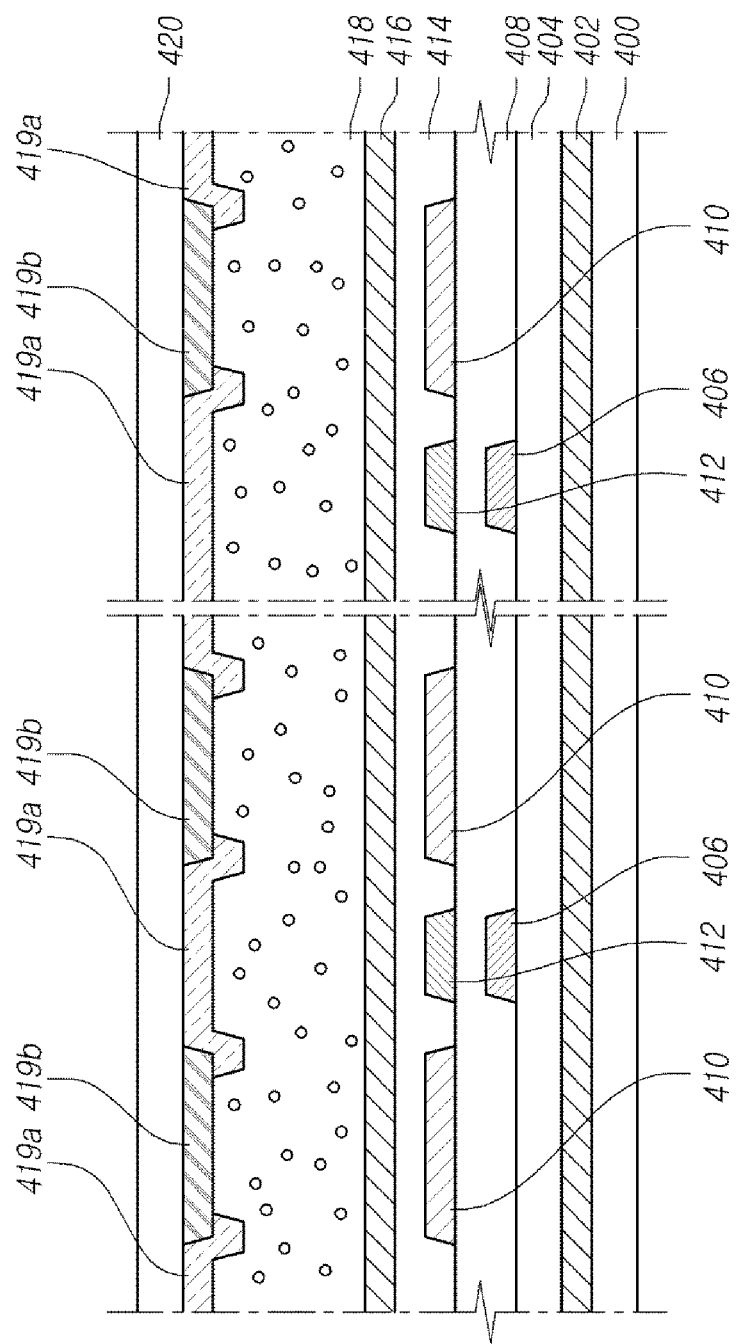
FIG. 4 is a view illustrating an example of a cross-sectional view of a panel when an example of a display device integrated with a touch screen panel is a liquid crystal display device.

FIG. 4 is a view illustrating an example of a cross-sectional view of a panel when an example of a display device integrated with a touch screen panel is a liquid crystal display device. In particular, FIG. 4 is a cross-sectional view illustrating a region (a touch electrode region) where one electrode is formed among the multiple electrodes S11 to S14, S21 to S24 and S31 to S34 which serve as the common electrodes as well as the touch electrodes.

Referring to FIG. 4, in the panel 110 included in the display device 100 integrated with the touch screen panel, for example, gate lines 402 are formed on a lower substrate 400 in a first direction, namely, a horizontal direction (a left-and-right direction in FIG. 4), and a gate insulator 404 is formed on the gate lines 402.

Data lines 406 are formed on the gate insulator 404 in a second direction, namely, a vertical direction perpendicular to the gate lines 402, and a first passivation layer 408 is formed on the data lines 406.

A pixel electrode 410 and a signal line 412 of each pixel region may be formed on the first passivation layer 408, and a second passivation layer 414 may be formed on the pixel electrode 410 and the signal line 412. Here, the signal lines 412 are connected from the respective multiple electrodes S11 to S14, S21 to S24 and S31 to S34, which serve as the common electrodes as well as the touch electrodes, to the touch IC 140. During the display driving mode, the signal lines 412 supply a common voltage Vcom generated by the common voltage supplier to the multiple electrodes S11 to S14, S21 to S24 and S31 to S34. During the touch driving mode, the signal lines 412 supply a touch driving signal generated by the touch IC 140 to the multiple electrodes S11 to S14, S21 to S24 and S31 to S34.

One electrode 416 serving as a common electrode as well as a touch electrode is formed on the second passivation layer 414, and a liquid crystal layer 418 is formed on the one electrode 416. Here, the one electrode 416 serving as a common electrodes as well as a touch electrode is one of the multiple electrodes S11 to S14, S21 to S24 and S31 to S34, and may have a block-shaped pattern.

An upper substrate 420, on which a black matrix 419a, a color filter 419b, and the like are formed, is provided on the liquid crystal layer 418.

Although an LCD device is described in FIG. 4, the present invention is not limited thereto, and may be applied to various display devices integrated with a touch panel.

Figure 5:
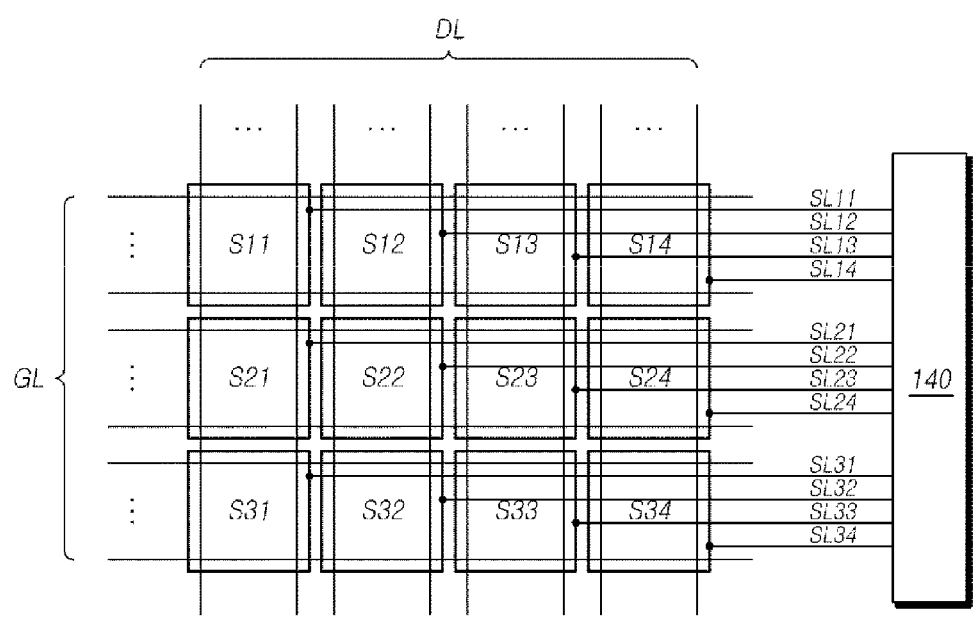
FIG. 5 is another plan view illustrating a panel included in an example of a display device integrated with a touch screen panel.

FIG. 5 is another plan view illustrating a panel included in an example of a display device integrated with a touch screen panel.

Referring to FIG. 5, the signal lines SL11 to SL14, SL21 to SL24 and SL31 to SL34, which are connected to the respective multiple electrodes S11 to S14, S21 to S24 and S31 to S34 and supply a touch driving signal or a common voltage thereto, may be formed in parallel to a second direction (e.g., a horizontal direction) in which the gate lines GL is formed, which is different from FIG. 3.

In this case, a touch driving signal generated by the touch IC 140 or a common voltage generated or supplied by the common voltage supplier may be supplied to all or some of the multiple electrodes S11 to S14, S21 to S24 and S31 to S34 through the signal lines SL11 to SL14, SL21 to SL24 and SL31 to SL34 which are formed in parallel with the gate lines GL.

Hereinafter, a method of manufacturing a display device integrated with a touch panel will be described. In particular, process steps for fabricating the signal lines (indicated by SL11 to SL14, SL21 to SL24 and SL31 to SL34 in FIG. 3 or FIG. 5, and hereinafter referred to as "touch signal lines") will be described in detail. Then, a reduced number of process steps according to an embodiment of the present invention is will be described.

In a fabrication process step, a touch signal line is referred to as a "conductive metal layer" (an M3L or a third conductive layer).

In an in-cell touch panel, it may need to form separate signal lines in order to form electrodes which are grouped or blocked and provide a common voltage, and thus, the number of separate mask steps to form the signal lines may increase. Accordingly, a description will be made of a process of etching, at one time, a first electrode (a pixel electrode) and a Thin Film Transistor (TFT) passivation layer (a planarization layer or an overcoat layer) formed on a TFT in order to reduce the number of masks, forming a first connection pattern connecting between the first electrode and a source electrode or drain electrode of the TFT by using a material identical to that of the touch signal lines, and forming each of a first electrode passivation layer formed on the first electrode and a second electrode by using one mask, and of a structure reflecting the process.

A TFT formed on a substrate (backplane) may be, for example, amorphous Silicon (hereinafter referred to as "a-Si"), metal oxide, and poly-silicon. Examples of poly-silicon may include Low Temperature Poly-Silicon (hereinafter referred to as "LTPS"), High Temperature Poly-Silicon, (hereinafter referred to as "HTPS"), and the like. However, the present invention is not limited thereto.

Figure 6A:
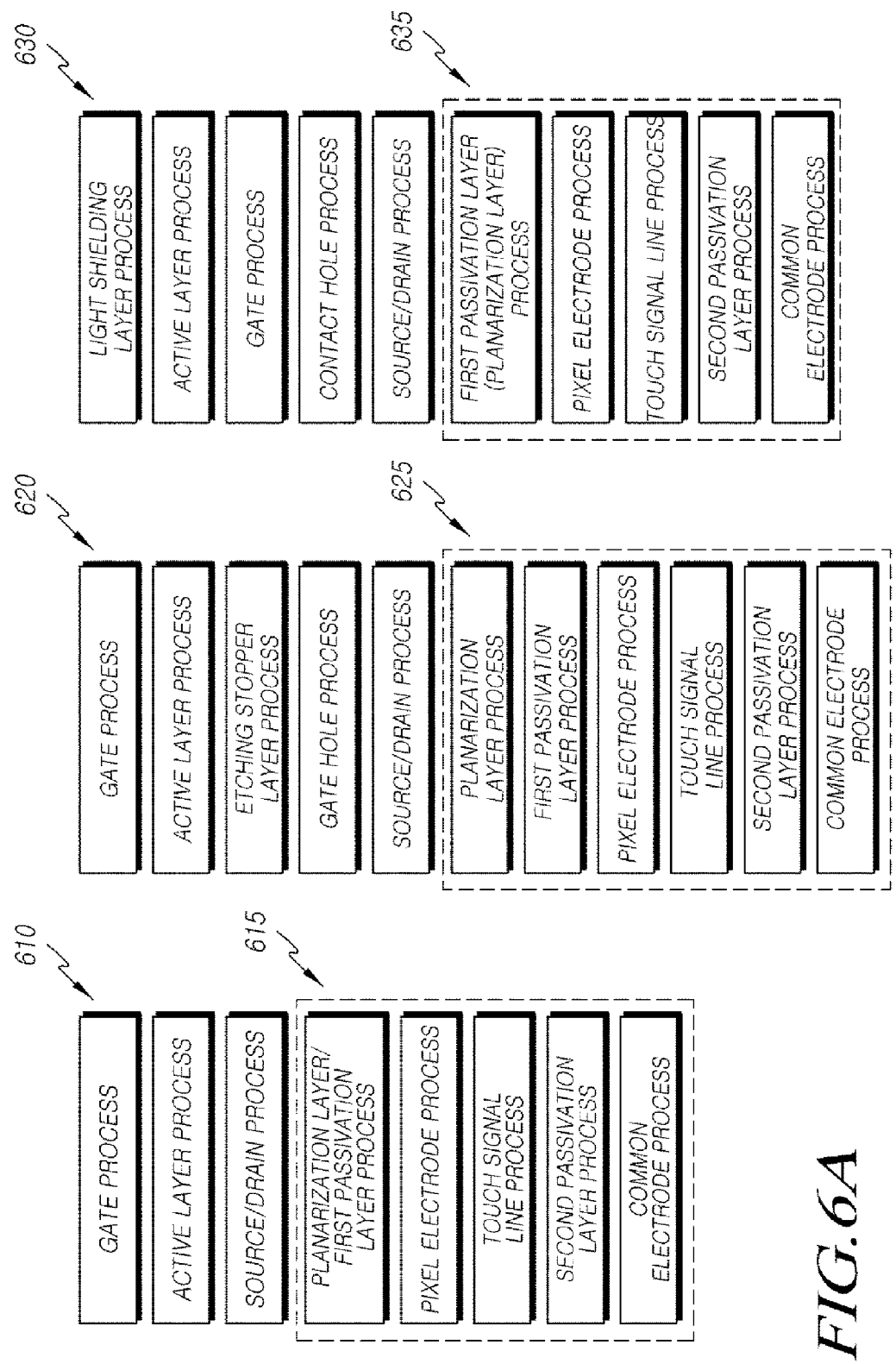
FIG. 6A is a view illustrating a fabrication process of a backplane for each thin film transistor.

FIG. 6A is a view illustrating a fabrication process of a backplane for each thin film transistor.

A method of fabricating an a-Si TFT backplane as indicated by reference numeral 610 includes forming a gate electrode and an active layer; forming a source electrode and a drain electrode; forming a planarization layer, a first passivation layer, a pixel electrode and a touch signal line; and forming a second passivation layer and a common electrode.

A method of fabricating a metal oxide TFT backplane as indicated by reference numeral 620 includes forming a gate electrode, an active layer, an etching stopper layer and a gate hole (G-hole); forming a source electrode and a drain electrode; forming a planarization layer, a first passivation layer, a pixel electrode and a touch signal line; and forming a second passivation layer and a common electrode.

A method of fabricating an LTPS TFT backplane as indicated by reference numeral 630 includes forming a light shielding layer LS, an active layer, a gate electrode, a contact hole, a source electrode and drain electrode; forming a first passivation layer (or a planarization layer) and a pixel electrode; and forming a touch signal line, a second passivation layer and a common electrode.

Figure 6B:
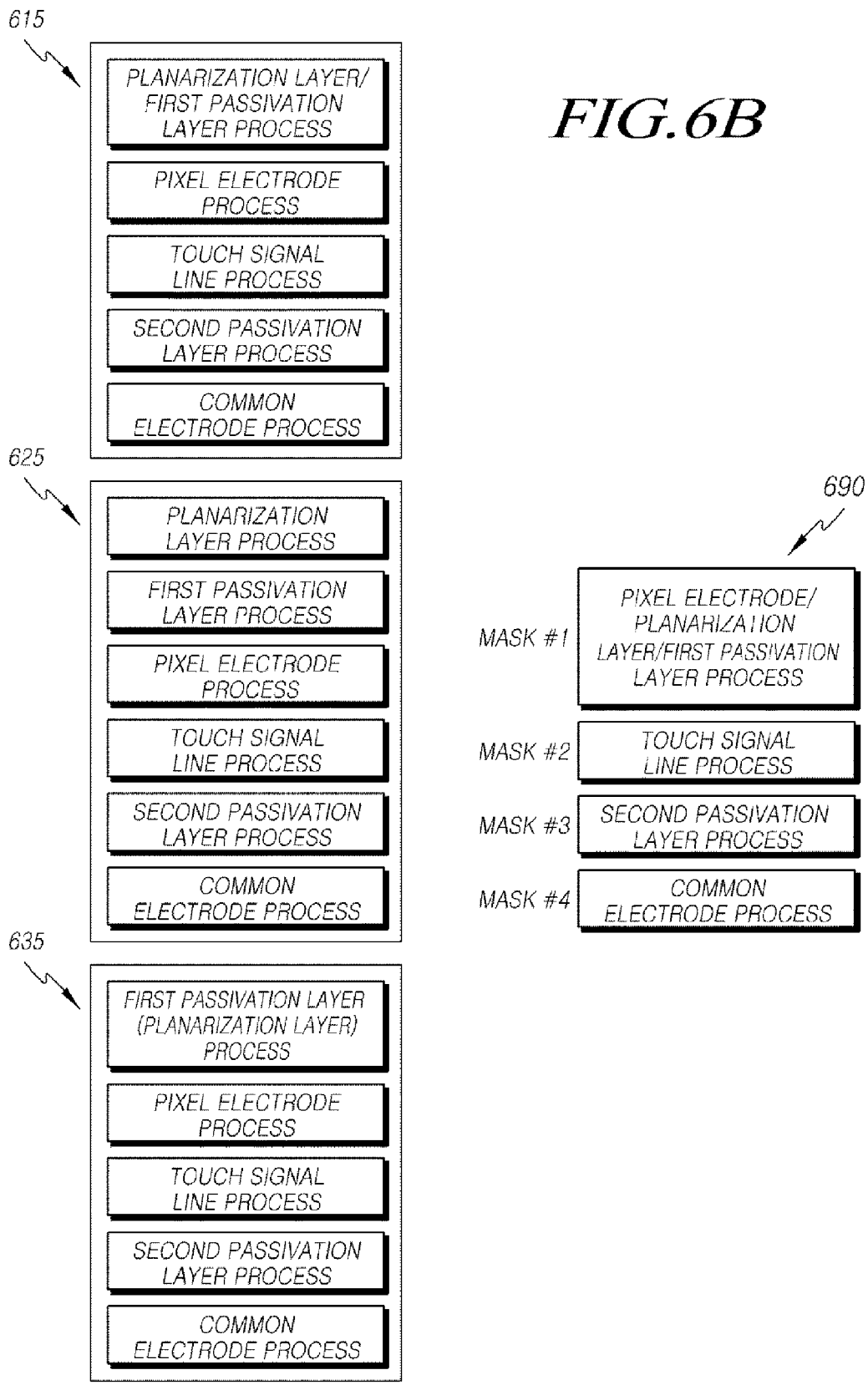
FIG. 6B is a view illustrating an example of a process according to an embodiment of the present invention.

FIG. 6B is a view illustrating an example of a process according to an embodiment of the present invention. Processes 615, 625 and 635 illustrated in FIG. 6A may be changed as illustrated in FIG. 6B.

As indicated by reference numeral 690, a first embodiment uses mask#1 to form a pixel electrode, a planarization layer and a first passivation layer, and uses mask#2 to form a touch signal line. In this process, the touch signal line is formed as a connection pattern so as to allow a material of the pixel electrode to contact a source or drain electrode.

Then, the first embodiment uses mask#3 to form a second passivation layer, and finally uses mask#4 to form a common electrode (Vcom electrode or Vdd electrode). As a result, five process steps, six process steps and five process steps are performed in process 615, process 625 and process 635, respectively. However, according to an embodiment of the present invention, four process steps can be performed.

In FIG. 6B, the planarization layer is an example of a TFT passivation layer, and an overcoat layer may be implemented instead of the planarization layer. The pixel electrode is an example of a first electrode, the second passivation layer is an example of a first electrode passivation layer, and the common electrode is an example of a second electrode.

FIGS. 7A to 7E are plan views illustrating a process of forming a pixel unit, a gate pad unit and a data pad unit of a display device according to an embodiment of the present invention.

Figure 7A:
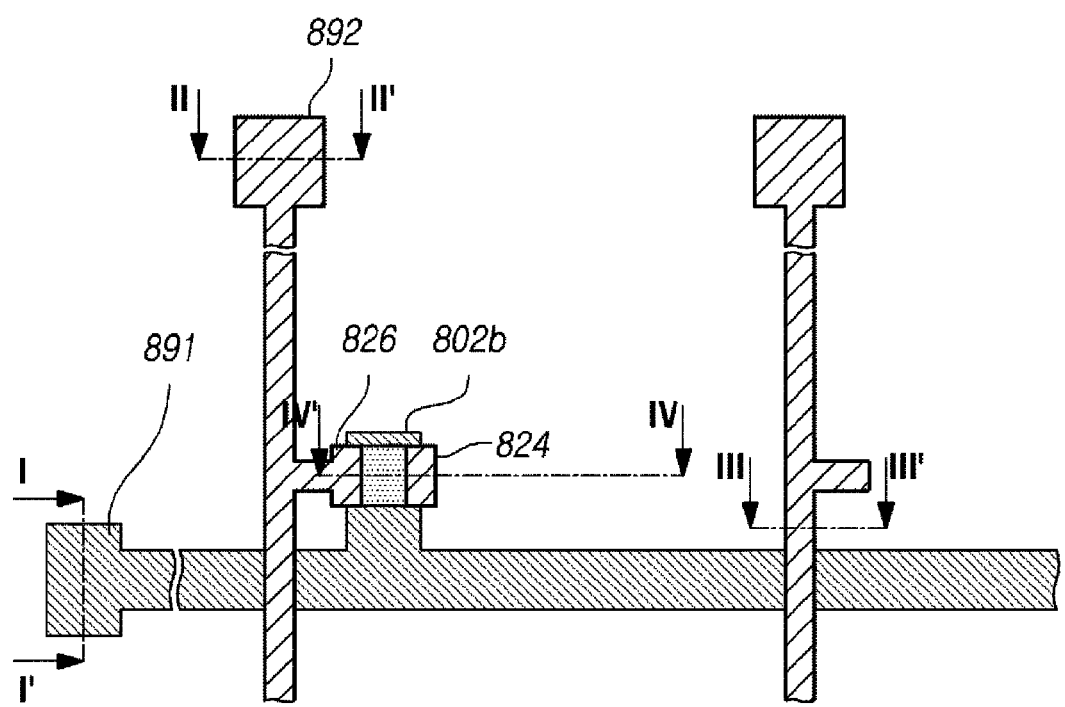
FIGS. 7A to 7E are plan views illustrating a process of forming a pixel unit, a gate pad unit and a data pad unit of a display device according to an embodiment of the present invention.

Referring to FIG. 7A, the gate pad unit 891, the data pad unit 892, a gate electrode 802b, an active layer 812, a source electrode 824 and a drain electrode 826 are formed. Two masks may be used to form the structure illustrated in FIG. 7A on a backplane. Although not illustrated in FIG. 7A, a first passivation layer and a TFT passivation layer (e.g., a planarization layer or an overcoat layer) may be formed on a TFT.

Figure 7B:
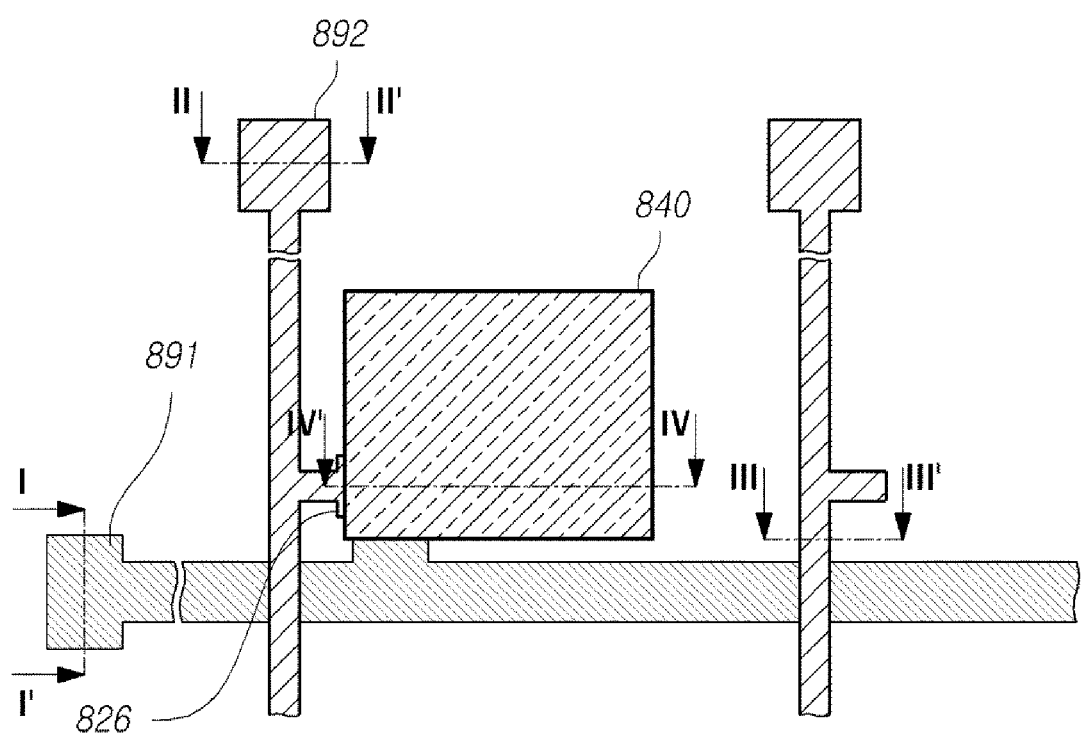

Referring to FIG. 7B, Indium Tin Oxide (ITO) 840 for a pixel electrode is formed, and a contact hole indicated by reference numeral 865 is formed by etching a particular region of a first electrode (e.g., a pixel electrode).

Figure 7C:
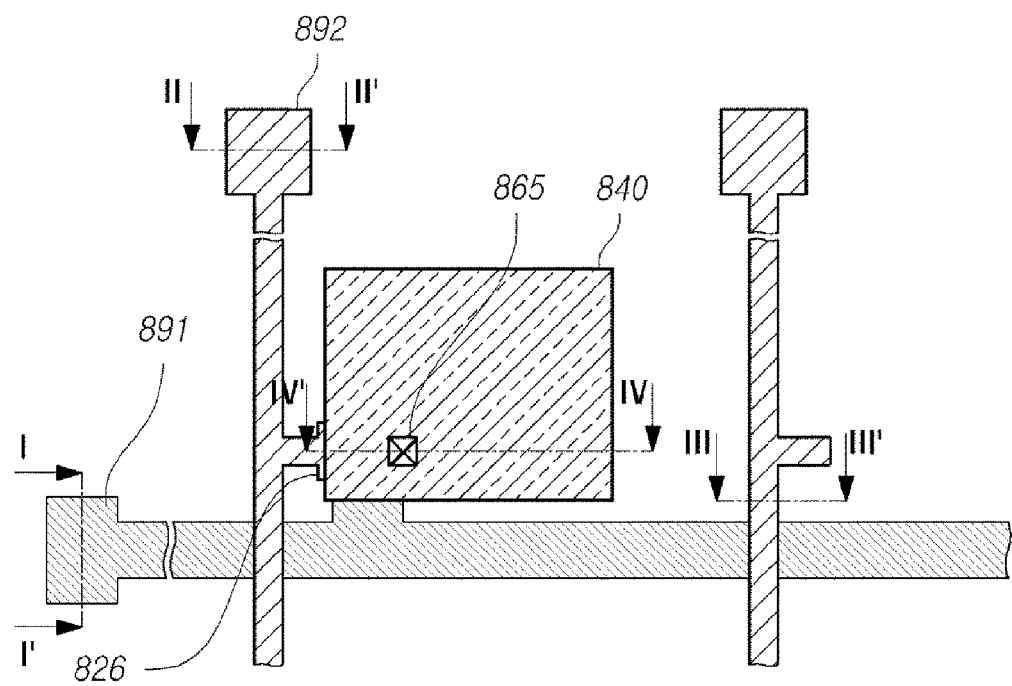

Referring to FIG. 7C, one mask may be used to etch the particular region of the pixel electrode and the first passivation layer and/or the TFT passivation layer which are/is formed on a lower surface of the particular region thereof. The first contact hole 865 formed in this process exposes the source electrode 824.

Figure 7D:
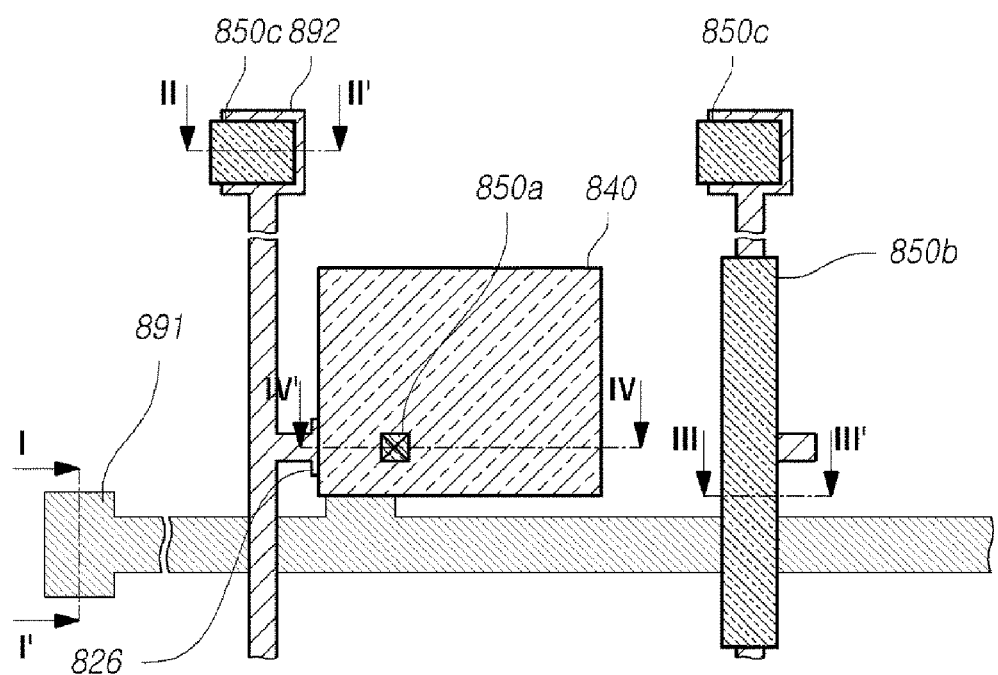

Referring to FIG. 7D, a conductive metal layer for a touch signal line as described above may be formed, and one mask may be used in this process. A connection pattern 850a, which connects the first electrode (e.g., the pixel electrode 840) to the source electrode 824, is formed through the contact hole 865. Simultaneously with forming the connection pattern 850a, a connection pattern 850c is formed on the data pad unit 892, and a connection pattern 850b is formed to connect a common electrode and a touch signal line that are subsequently formed.

Figure 7E:
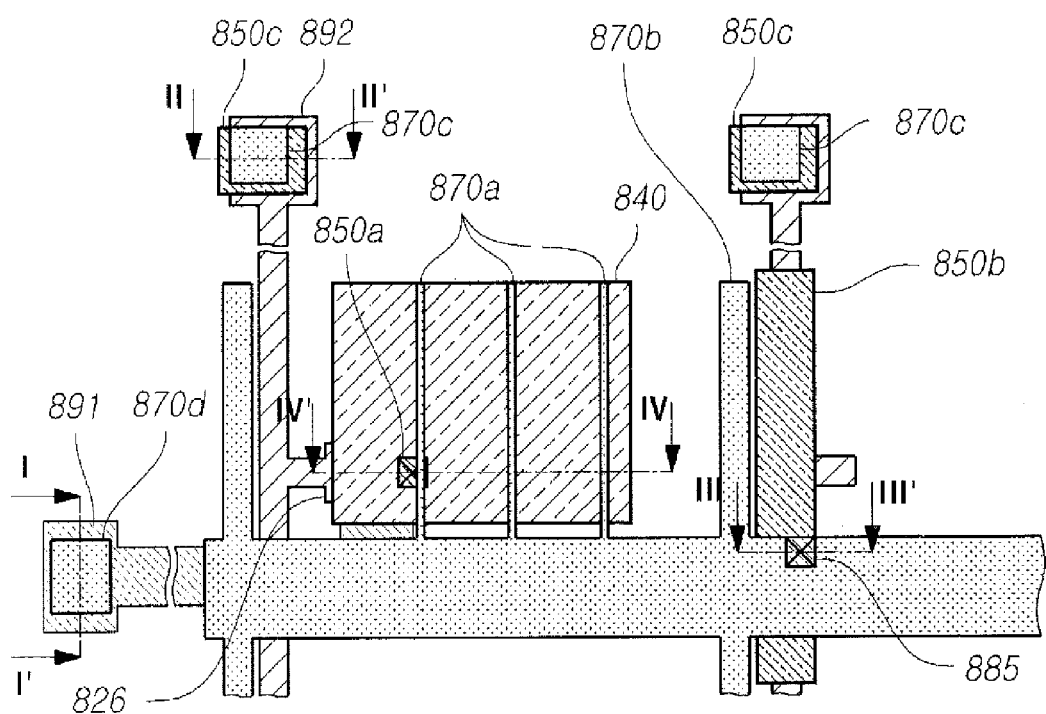

Referring to FIG. 7E, common electrodes 870a and 870b are then formed by using one mask, and simultaneously with the common electrodes 870*a* and 870*b*, a gate pad connection portion 870*d* is formed on the gate pad unit 891 and a data pad connection portion 870*c* is formed on the data pad unit 892. Also, before being connected to the touch signal line, the common electrode 870*b* is connected to the second connection pattern 850*b* through a second contact hole 885.

The structure of the in-cell type display device, which can be completed by the above-described processes or modified processes thereof, can be summarized as follows. Description of the parts that are already described with reference to FIGS. 1, 3 and 5 may be omitted. The display device includes multiple gate lines, multiple data lines, multiple TFTs and pixels, and first electrodes and second electrodes that control the multiple TFTs and pixels. First connection patterns may be formed for each pixel, and second connection patterns may be formed for each of the second electrodes that allow the multiple pixels to be grouped. However, the present invention is not limited thereto.

More specifically, a gate line, which is disposed in a first direction to supply a gate signal, is provided on the backplane, and a data line, which is disposed in a second direction to supply a data signal, is provided on the backplane. Multiple TFTs are provided in such a manner that a TFT is provided in each pixel defined by a crossing between one of the gate lines and one of the data lines. A first electrode is provided so as to be spaced apart from one of a source electrode and a drain electrode of the TFT, and a second electrode is provided so as to correspond to the first electrode. As illustrated in FIG. 7C, a TFT passivation layer (e.g., a planarization layer or an overcoat layer) is formed on the TFT, and a first contact hole is formed in the TFT passivation layer. Alternatively, a first passivation layer may be further included, and the first contact hole may also be formed in the first passivation layer.

Included are a first connection pattern that connects one of the source electrode and the drain electrode to the first electrode through the first contact hole, and a second connection pattern, which supplies a touch driving signal to the second electrode, may be formed of a material identical to that of the first connection pattern. The first connection pattern and the second connection pattern may be formed in a process of forming a touch signal line.

In a Common electrode On Top (COT) structure for forming the second electrode after forming the first electrode, the first electrode is first formed, a first electrode passivation layer (e.g., a second passivation layer) is provided on the first electrode, and the second electrode is provided on the first electrode passivation layer. Alternatively, in a Pixel electrode On Top (POT) structure for forming the first electrode after forming the second electrode, after the second electrode is formed, a second electrode passivation layer (e.g., a second passivation layer) may be provided on the second electrode, and the first electrode may be provided on the second electrode passivation layer.

According to an embodiment of the present invention, the first electrode may be first formed, and the first connection pattern may be formed on the first electrode in such a manner that a partial region of the first connection pattern overlaps a surface of the first electrode. In this case, the first connection pattern may be provided on the first electrode. Alternatively, according to another embodiment of the present invention, a first connection pattern may be first formed, and the first electrode may be formed. Here, the first electrode may be provided on the first connection pattern, and the first connection pattern may be provided on a lower surface of the first electrode in such a manner that a partial region of the first connection pattern overlaps the lower surface of the first electrode. A second connection pattern is formed in a first or second direction and connected to a touch signal line which has been provided, and is connected to the second electrode through a second contact hole formed in a first electrode passivation layer. A gate pad connection portion and a data pad connection portion may be formed in a process identical to that of the second electrode. Before the gate pad connection portion and the data pad connection portion are formed, a third connection pattern, which may be formed of a material identical to that of the first connection pattern and the second connection pattern, may be located on a lower surface of the data pad connection portion.

During the display driving mode, the second electrodes may serve as common electrodes to which a common voltage is applied. During the touch driving mode, the second electrodes may serve as touch electrodes to which a touch driving signal is applied.

An embodiment of the present invention may be applied to both an LCD device, an OLED device, and the like.

Figure 8:
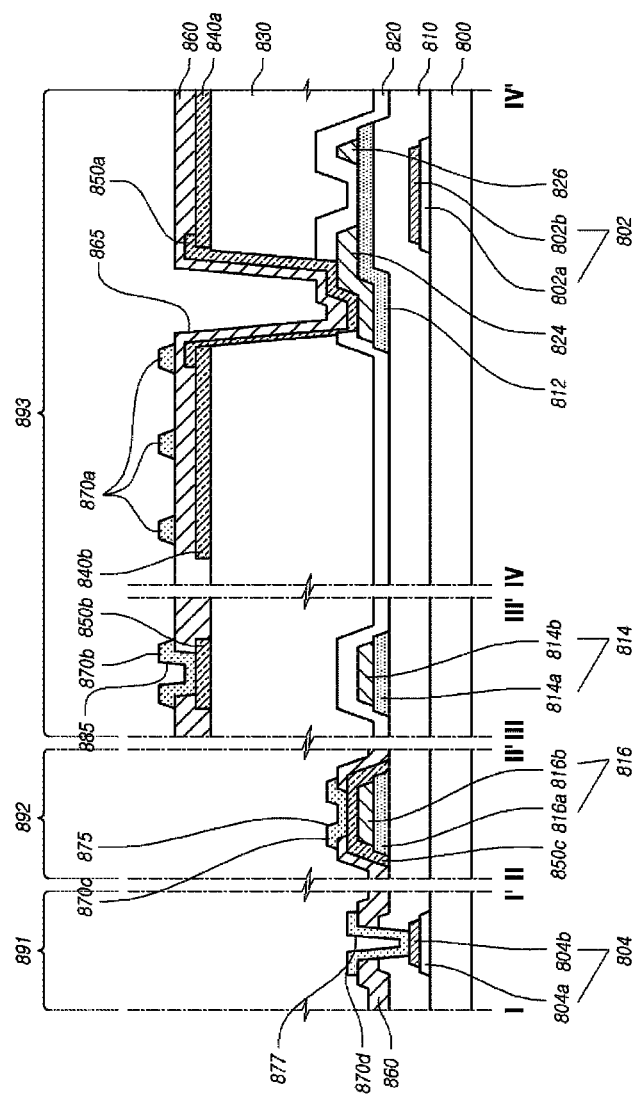
FIG. 8 is a cross-sectional view illustrating a pixel unit, a gate pad unit and a data pad unit of a display device according to an embodiment of the present invention.

FIG. 8 is a cross-sectional view illustrating a pixel unit, a gate pad unit and a data pad unit of a display device according to an embodiment of the present invention. In particular, FIG. 8 illustrates cross-sections taken along lines I-I', II-II', III-III' and IV-IV' in FIG. 7E.

The gate pad unit 891 and the data pad unit 892 may be formed by using materials identical to those for forming respective TFTs in the pixel unit 893 and by using processes identical to those of forming the respective TFTs in the pixel unit.

Referring to FIG. 8, in the pixel unit 893 of the display device according to an embodiment of the present invention, a gate electrode 802 is located on a backplane 800. The gate electrode 802 may be formed as a double-electrode structure 802*a* and 802*b* including a conductive metal layer and a transparent conductive material layer as described below. However, the gate electrode 802 is not limited thereto, and may have a single electrode structure or a multi-electrode structure.

Also, a gate line 804*a* and 804*b*, which is an element of the gate pad unit 891 formed of a material identical to that of the gate electrode 802, is formed on the backplane 800.

A gate insulator 810 is formed on the gate electrode 802 and the gate line 804 for the gate pad unit 891. The active layer 812, the source electrode 824 and the drain electrode 826 are formed on the gate insulator 810. Also, a data line 814*a* and 814*b* and a data line 816*a* and 816*b* for the data pad unit 892 are formed on the gate insulator 810.

A first passivation layer 820 and a TFT passivation layer 830 are sequentially formed on the source electrode 824, the drain electrode 826, the data line 814*a*, 814*b* and the data line 816*a* and 816*b*. In one example, the first passivation layer 820 may be omitted and the TFT passivation layer 830 may be laminated. An example of the TFT passivation layer 830 may include a planarization layer 830 or an overcoat layer.

A first electrode 840*a* and 840*b* is formed on the TFT passivation layer 830. An example of the first electrode 840*a* and 840*b* is a pixel electrode. A conductive metal layer 850*a* among conductive metal layers 850*a*, 850*b* and 850*c* is a first connection pattern that connects one of the source electrode 824 and the drain electrode 826 to the first electrode 840*a* and 840*b*. The conductive metal layer 850*b* is a second connection pattern to supply a touch driving signal to the second electrode 870*b*. The conductive metal layer 850*c* is formed as a third connection pattern on the data line 816*a* and 816*b* for the data pad unit 892, and the third connection pattern connects the data pad connection portion 870*c* as described below to the data line 816*a* and 816*b*.

A first electrode passivation layer 860 is formed on the first electrode 840*a* and 840*b*, and may be the second passivation layer as described above in one example. The second electrodes 870*a*, 870*b*, 870*c* and 870*d* are formed on the first electrode passivation layer 860. The second electrodes 870*a*, 870*b*, 870*c* and 870*d* may serve as common electrodes in the display driving mode, or may serve as touch electrodes to which a touch driving signal is applied in the touch driving mode.

As described above, reference numeral 870*c* indicates a data pad connection portion to which a data driver connects, and reference numeral 870*d* indicates a gate pad connection portion to which a gate driver connects.

In FIG. 8, a first contact hole 865, a second contact hole 885, a third contact hole 875 and a fourth contact hole 877 are illustrated, which will now be described. FIG. 8 illustrates a configuration of the data pad unit and the gate pad unit which correspond to one pixel. When such a configuration is extended to the entire display device, the extended configuration is described as follows.

A TFT is provided in each of an N×P number of pixels defined by crossings between the gate lines that are located in a first direction on a backplane and deliver gate signals, and data lines that are located in a second direction on the backplane and deliver data signals. The N×P number of first electrodes are provided, each of which is located so as to be spaced apart from one of a source electrode and a drain electrode of the TFT. A first electrode may exist for each pixel, and the N×P number of first electrodes may be formed. The P number of second electrodes are provided, each of which is located so as to correspond to the first electrode to provide an identical signal to all of an N number of pixels. This configuration may imply that one second electrode serves as a common electrode of the N number of grouped pixels as well as a touch electrode thereof. In this regard, the total P number of second electrodes exist and thus, serve as common electrodes of all of the N×P number of pixels as well as touch electrodes thereof.

A TFT passivation layer is provided on the TFT and has a first contact hole formed therein, and the N×P number of first connection patterns are formed on an N×P number of TFTs, each of which connects the first electrode to one of the source electrode or the drain electrode through the first contact hole. Such a first connection pattern connects a first electrode to a source electrode or a drain electrode of a TFT.

Included are the P number of second connection patterns that supply a touch driving signal to the P number of second electrodes and may be formed of a material identical to that of the first connection patterns. The display panel includes the gate lines, the data lines, the TFTs, the first electrodes and the second electrodes, and the first connection patterns and the second connection patterns.

The display device includes the display panel, the touch IC that supplies a touch driving signal to all or some of the multiple second electrodes during the touch driving mode, the data driver that supplies data voltages to the multiple data lines during the display driving mode, and the gate driver that sequentially supplies scan signals to the multiple gate lines during the display driving mode.

In the COT structure for forming the second electrode after forming the first electrode, the first electrode is first formed, a first electrode passivation layer (e.g., a second passivation layer) is formed on the first electrode, and the second electrode is formed on the first electrode passivation layer. Alternatively, in the POT structure for forming the first electrode after forming the second electrode, after the second electrode is formed, a second electrode passivation layer (e.g., a second passivation layer) may be formed on the second electrode, and the first electrode may be formed on the second electrode passivation layer.

According to an embodiment of the present invention, the first electrode may be first formed, and the first connection pattern may be formed on the first electrode in such a manner that a partial region of the first connection pattern overlaps the surface of the first electrode. In this case, the first connection pattern may be formed on the first electrode. Alternatively, according to another embodiment of the present invention, a first connection pattern may be first formed, and the first electrode may be formed. Here, the first electrode may be formed on the first connection pattern, and the first connection pattern may be formed on a lower surface of the first electrode in such a manner that a partial region of the first connection pattern overlaps the lower surface of the first electrode. A second connection pattern is formed in a first or second direction and is connected to a touch signal line which has been provided, and is connected to the second electrode through a second contact hole formed in a first electrode passivation layer. A gate pad connection portion and a data pad connection portion may be formed in a process identical to that of the second electrode. Before the gate pad connection portion and the data pad connection portion are formed, a third connection pattern, which may be formed of a material identical to that of the first connection pattern and the second connection pattern, may be formed on a lower surface of the data pad connection portion.

When the display device operates in a display driving mode, the second electrodes may serve as the common electrodes to which a common voltage is applied. When the display device operates in a touch driving mode, the second electrodes may serve as the touch electrodes to which a touch driving signal is applied.

An embodiment of the present invention may be applied to both an LCD device and an OLED device, or other various types of display devices.

Figure 9:
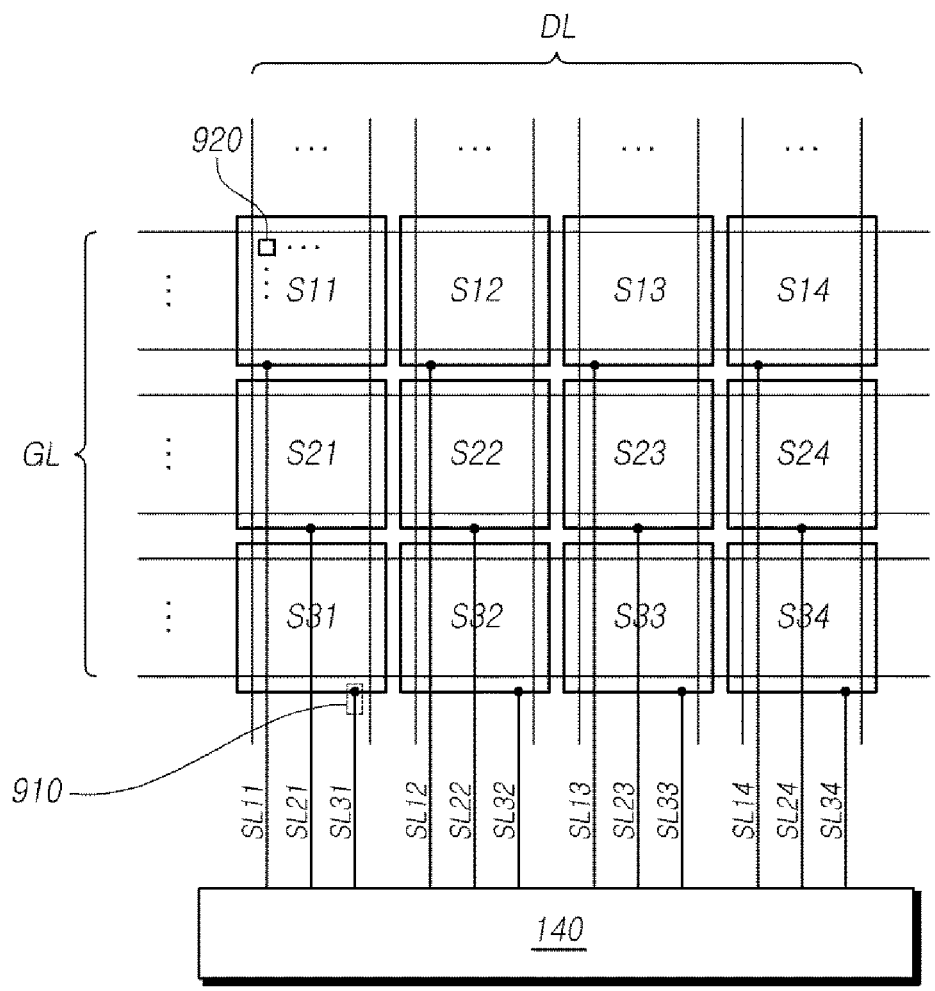
FIG. 9 is a view illustrating a configuration of a display device according to an embodiment of the present invention.

FIG. 9 is a view illustrating a configuration of a display device according to an embodiment of the present invention.

Referring to FIG. 9, an N×P number of pixels and TFTs associated with the N×P number of pixels are formed in regions where data lines cross gate lines. The P number of common electrodes are provided at one region where the N number of pixels are grouped. The P number of common electrodes have a pixel region indicated by reference numeral 910, and the pixel region 910 shows the region of pixels where the above-described second connection pattern is provided. A typical pixel region does not have a connection pattern between a touch signal line and a common electrode, as indicated by reference numeral 920.

Processes for forming the connection patterns 850*a*, 850*b* and 850*c* illustrated in FIG. 8 with a reduced number of masks will be described below.

Figure 10:
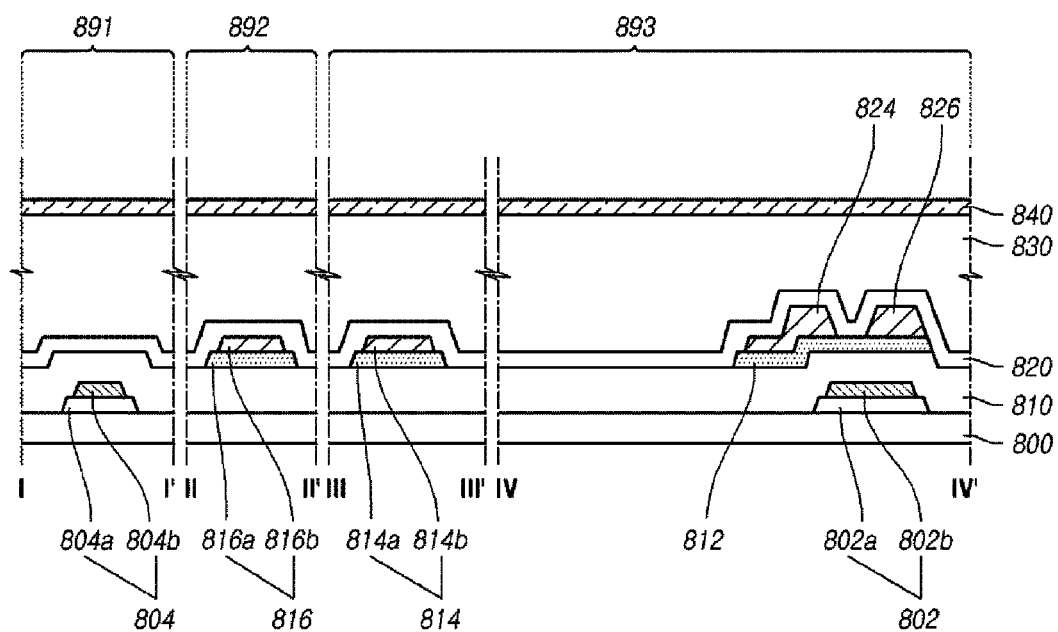
FIG. 10 is a cross-sectional view illustrating a state of stacking and laminating a thin film transistor, a first passivation layer, a planarization layer, and a first electrode.

FIG. 10 is a cross-sectional view illustrating a thin film transistor, a first passivation layer, a planarization layer, and a first electrode.

A gate electrode 802 is formed in a double-electrode structure 802*a* and 802*b* on a backplane 800. In this process, a gate line 804, which is connected to a gate pad connection portion to which a gate driver is connected, is also formed in the double electrode structure 804*a* and 804*b*.

Reference numerals 802*a* and 804*a* both indicate a conductive metal layer, and may be formed of at least one selected from the conductive metal group including aluminum (Al), tungsten (W), copper (Cu), molybdenum (Mo), chromium (Cr), titanium (Ti), molly tungsten (MoW), molly titanium (MoTi), and copper/moly-titanium (Cu/MoTi). However, the present invention is not limited thereto. Also, reference numerals 802b and 804b both indicate a transparent conductive material layer, and may be formed of one selected from the group including Indium Tin Oxide (ITO), Indium Zinc Oxide (IZO), and Carbon Nano Tube (CNT). However, the present invention is not limited thereto. The gate electrode 802 and the gate line 804 are not limited to the double-layer structure, and thus, the gate electrode 802 and the gate line 804 may be formed in a single-layer structure or multi-layer structure.

One mask may be used in a process of forming a gate line, namely, in forming the gate electrode 802 and the gate line 804 illustrated in FIG. 10. A gate insulator 810 may be formed on the gate electrode 802 and the gate line 804.

An active layer 812, a source electrode 824 and a drain electrode 826 are formed on the gate insulator 810. In this process, data lines 814 and 816 are formed together. Similarly, one mask may be used during this process.

More specifically, the active layer 812 may be formed of, for example, a semiconductor material such as amorphous silicon, or poly-silicon such as LTPS or HTPS. Alternatively, the active layer 812 may be formed of an oxide semiconductor material, such as Zinc Oxide (ZO), Indium Galiumzinc Oxide (IGZO), Zinc Indium Oxide (ZIO), or Ga-doped ZnO (ZGO).

Then, a TFT is completed by simultaneously forming the source electrode 824 and the drain electrode 826 by using a thin film formation process, such as sputtering, deposition, or the like.

A first passivation layer 820 is formed on the TFT. The first passivation layer 820 may be formed of an inorganic material such as $SiO_2$ or $SiN_x$, or an organic material such as photo acryl (PA) or the like. However, the present invention is not limited thereto.

Then, a TFT passivation layer 830 is formed on the first passivation layer 820. A planarization layer, which is an example of the TFT passivation layer 830, has a permittivity ranging from several tens to several hundreds, and may be formed of light rare earth oxide such as $LaAlO_3$, $La_2O_3$, $Y_2O_3$ or $LaAl_3O_6$, rare earth complex oxide, barium strontium titanate (BST) oxide, or the like. However, the present invention is not limited thereto. Alternatively, the TFT passivation layer 830 may be formed, as an overcoat layer, of an organic material. The TFT passivation layer 830 (e.g., the planarization layer or the overcoat layer) may compensate for a step difference between electrodes, and thereby planarization can be achieved between the electrodes.

A first electrode layer 840 is formed on the TFT passivation layer 830. The first electrode layer 840 may be formed of a transparent conductive material, such as Indium Tin Oxide (ITO), Indium Zinc Oxide (IZO), Indium Tin Zinc Oxide (ITZO), or the like. The first electrode layer 840 may provide a function of a pixel electrode through a subsequent process, and may be connected to the source electrode 824 or the drain electrode 826.

As a photolithography process, a photoresist may be first coated, light may be irradiated onto a mask after the mask including a light-transmitting portion and a light-shielding portion is covered on the photoresist, and thereby a photoresist having a particular desired pattern may be formed. The light transmitted the light-transmitting portion may harden the photoresist, and the remaining photoresist may be developed or not developed.

FIGS. 11A to 11D are cross-sectional views illustrating a process of forming a first electrode by using one mask according to an embodiment of the present invention. Hereinafter, a total of 4 masks described with reference to FIG. 6B are used in process steps illustrated in FIGS. 11A to 13E, and are referred to as first to fourth masks.

Figure 11A:
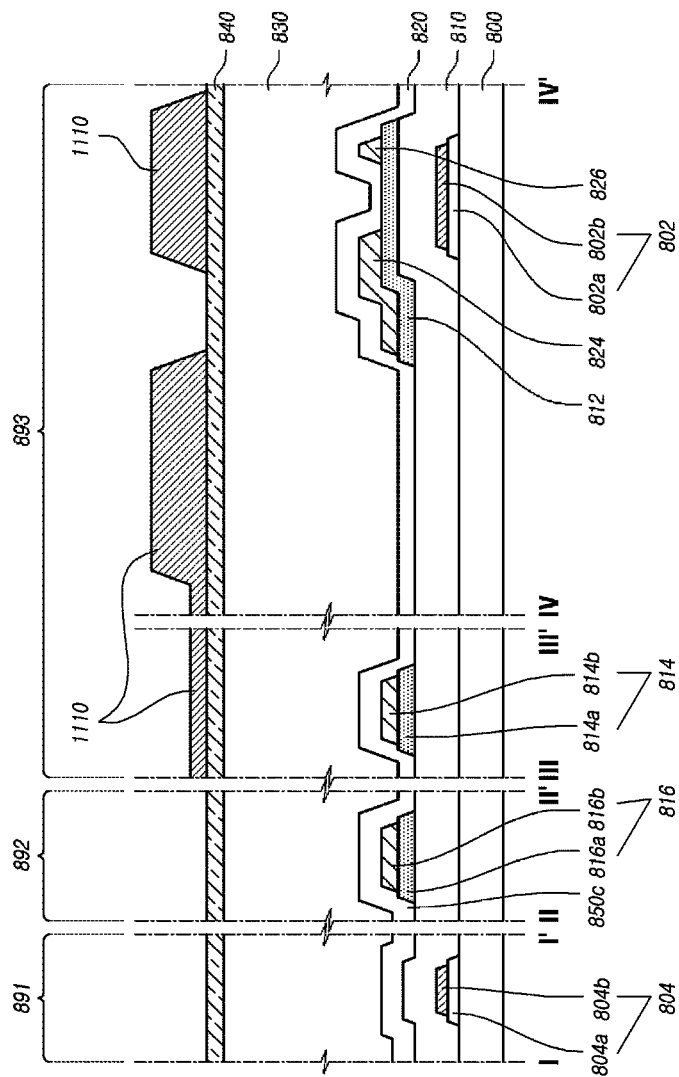
FIGS. 11A to 11D are cross-sectional views illustrating a process of forming a first electrode by using one mask according to an embodiment of the present invention.

Referring to FIG. 11A, a photoresist 1110 is formed by using the first photomask on the structure laminated as illustrated in FIG. 10. In one example, the photoresist 1110 is formed so as to have three heights by using a halftone mask, a diffraction mask, or the like.

Figure 11B:
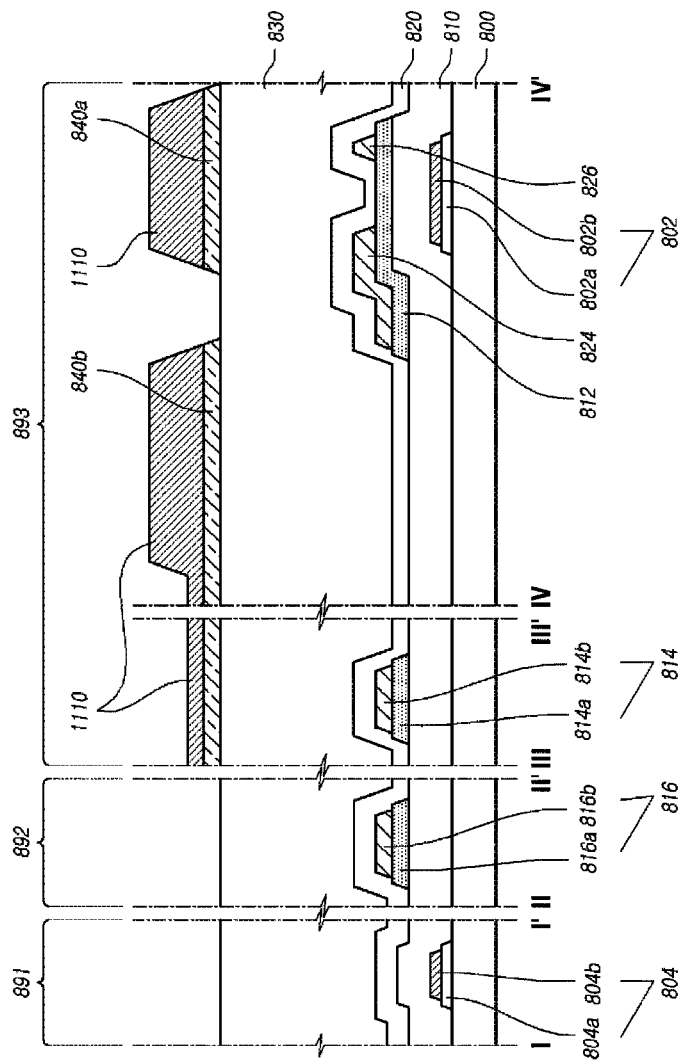

Referring to FIG. 11B, the first electrodes 840a and 840b having a particular pattern are formed by etching a part of the first electrode layer 840 in such a manner as to perform a wet etching by using the photoresist 1110.

Figure 11C:
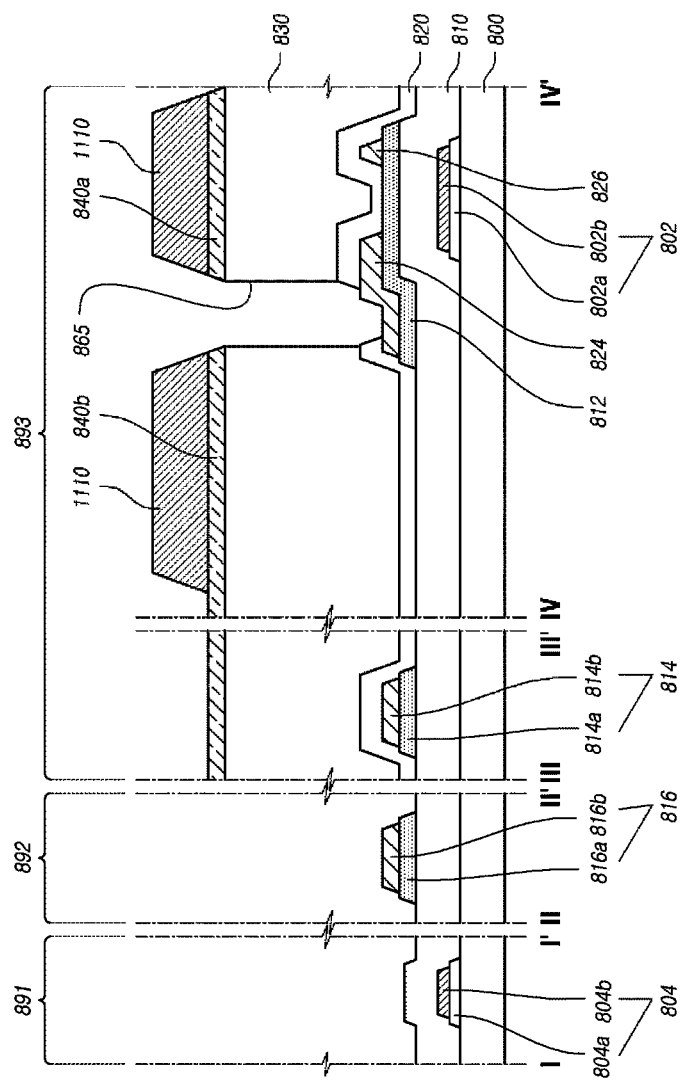

Referring to FIG. 11C, the structure is formed by etching a part of the TFT passivation layer 830 and the first passivation layer 820 in such a manner as to perform a dry etching by using the photoresist 1110. The photoresist 1110 is the photoresist 1110 illustrated in FIG. 11B that remains after being etched. Also, a first contact hole 865 is formed.

Figure 11D:
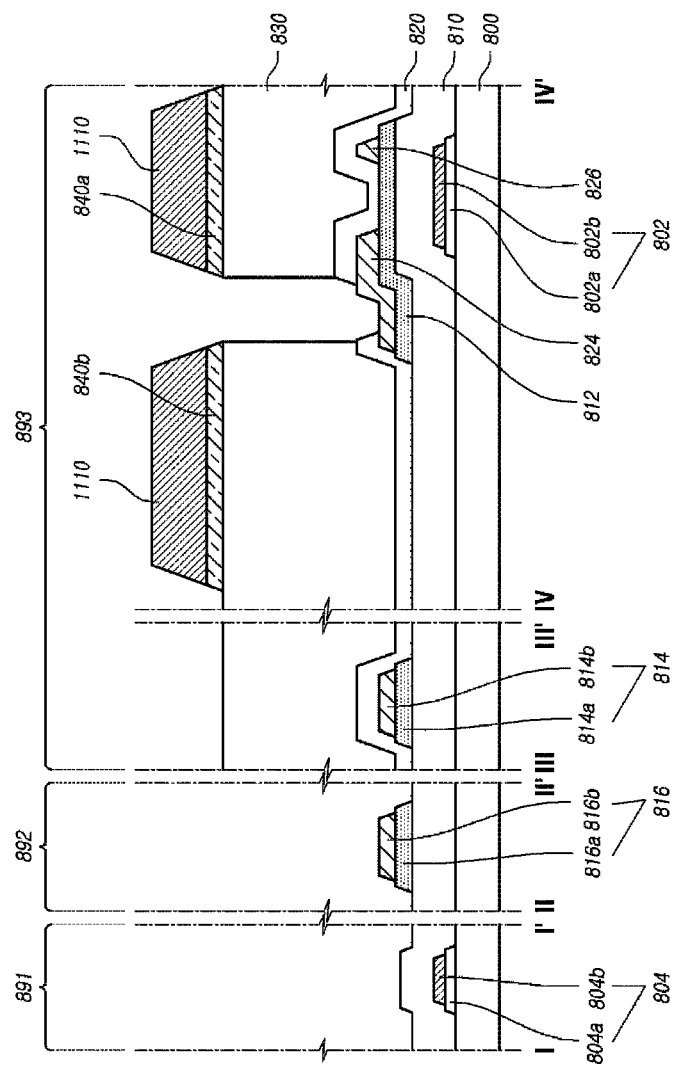

Referring to FIG. 11D, the first electrode 840b having a particular pattern is formed by additionally etching a part of the first electrode 840b in such a manner as to perform a second wet etching on the photoresist 1110 illustrated in FIG. 11C.

Figure 12:
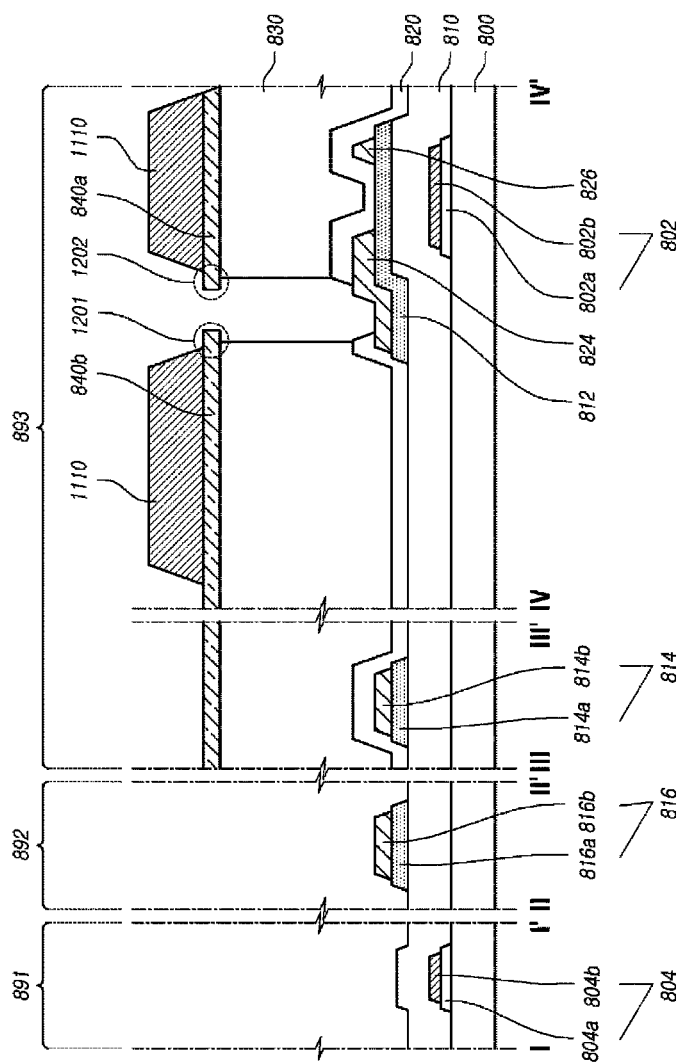
FIG. 12 is a cross-sectional view illustrating a protrusion part of a first electrode after performing dry etching according to an embodiment of the present invention.

FIG. 12 is a cross-sectional view illustrating a protrusion part of a first electrode after performing a dry etching according to an embodiment of the present invention.

Side parts 1201 and 1202 of the first electrodes 840a and 840b may protrude as illustrated in FIG. 12 in the process of performing a dry etching as illustrated in FIG. 11B. In this case, when the second wet etching illustrated in FIG. 11D is performed, the protrusion parts 1201 and 1202 may be removed together in the process of additionally etching a part of the first electrode 840b.

FIGS. 13A to 13E are cross-sectional views illustrating a process of forming a connection pattern, forming a first electrode passivation layer and forming a second electrode by using three photomasks according to an embodiment of the present invention.

Figure 13A:
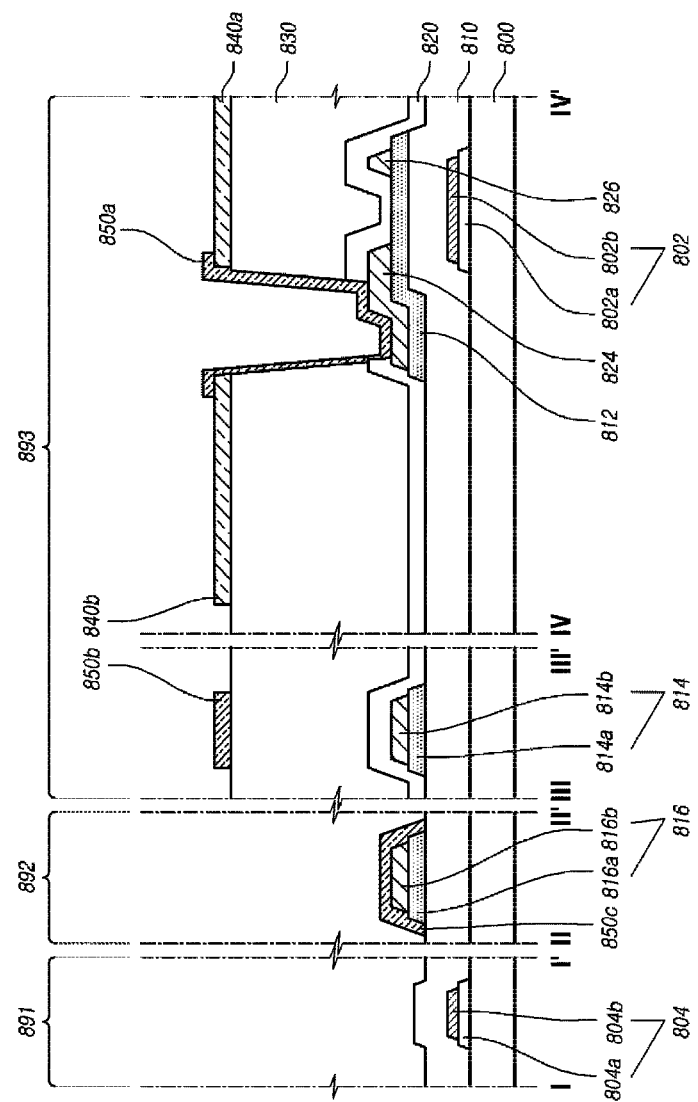
FIGS. 13A to 13E are cross-sectional views illustrating a process of forming a connection pattern, forming a first electrode passivation layer and forming a second electrode by using three photomasks according to an embodiment of the present invention.

Referring to FIG. 13A, the photoresist 1110 illustrated in FIG. 11D is removed, and a touch signal line, a second connection pattern 850b, a first connection pattern 850a and a third connection pattern 850c are formed by using a mask (the second photomask).

Figure 13B:
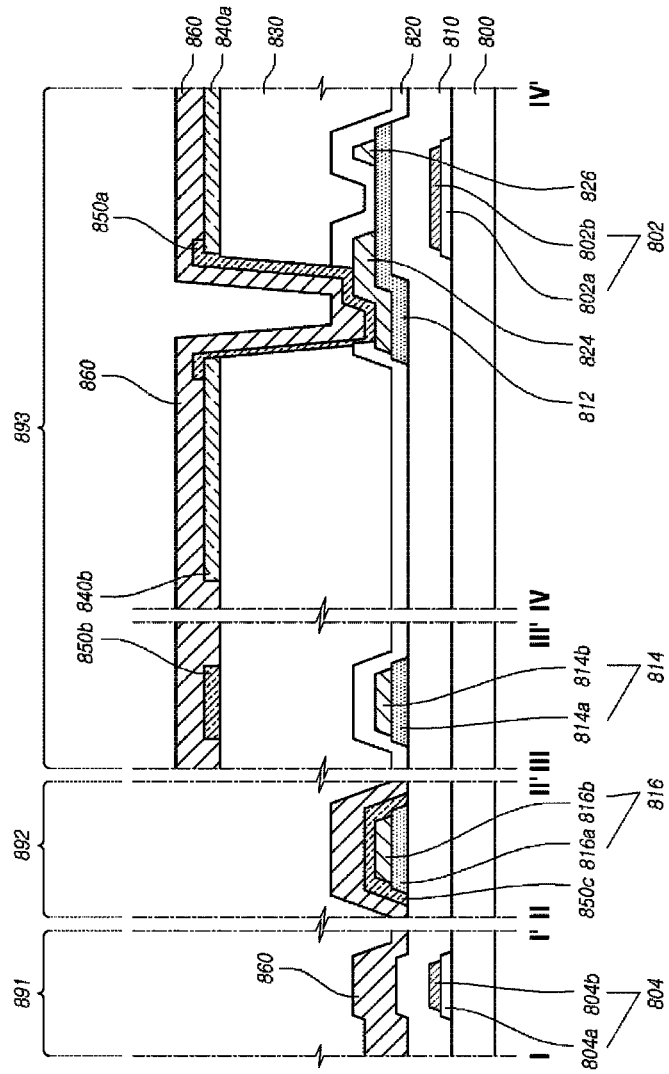

FIG. 13B is a view illustrating the first electrode passivation layer 860. An example of the first electrode passivation layer 860 may be a second passivation layer. However, the present invention is not limited thereto. Alternatively, when the second electrode is formed before the first electrode according to another embodiment of the present invention, the first electrode passivation layer may be referred to as a "second electrode passivation layer."

Figure 13C:
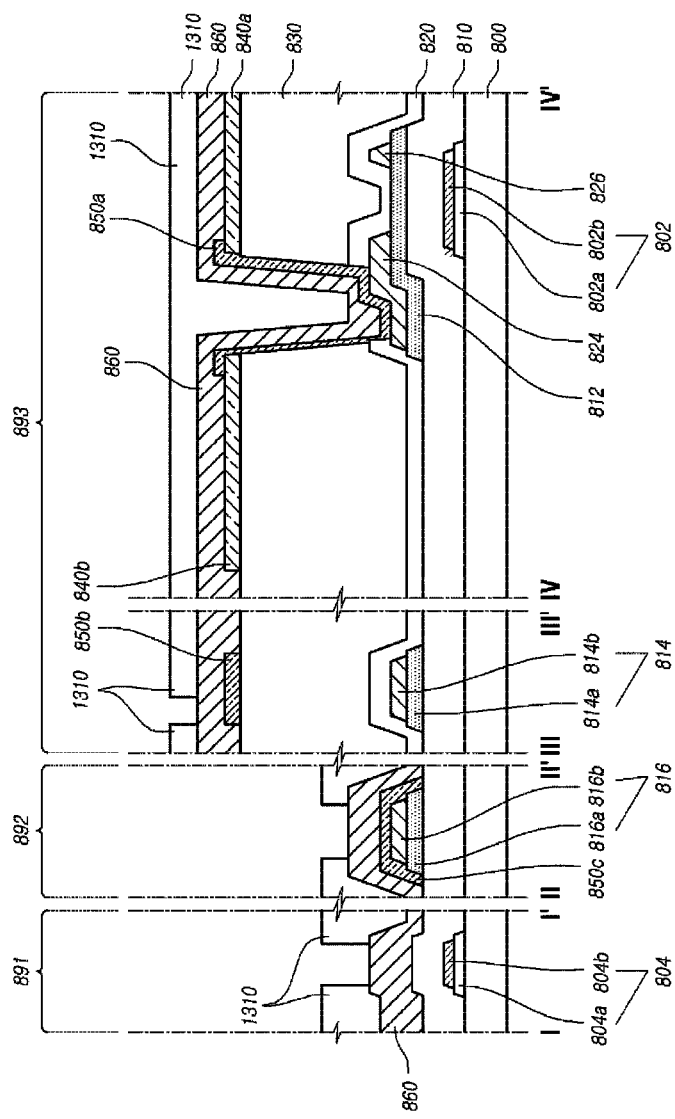

Referring to FIG. 13C, a photoresist 1310 is formed on the first electrode passivation layer 860 by using one mask (the third photomask), and a dry etching is performed.

Figure 13D:
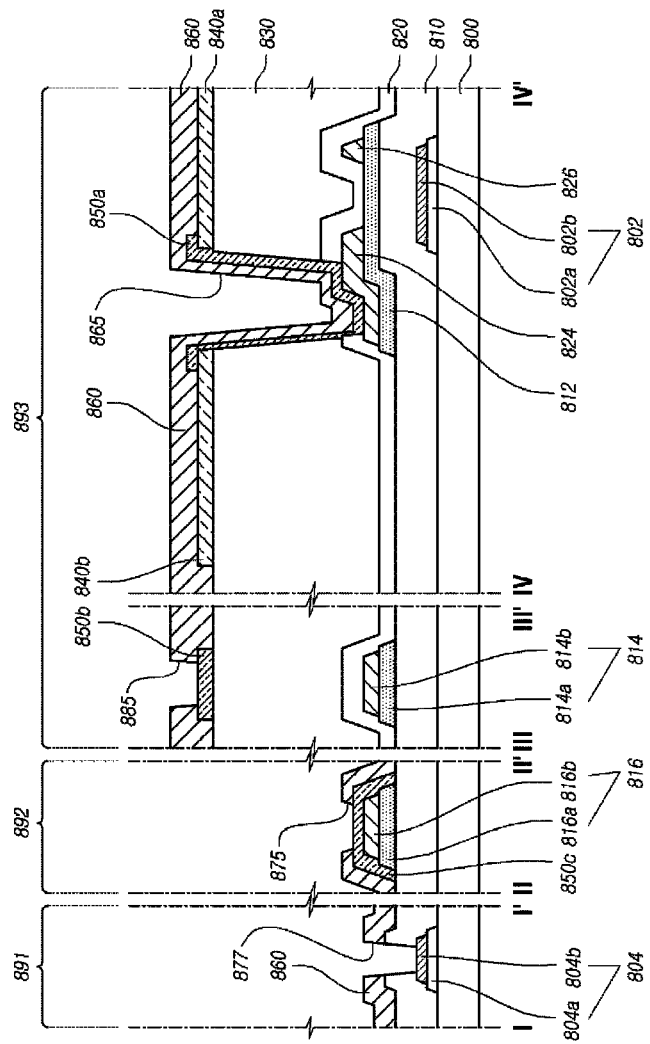
Figure 13E:
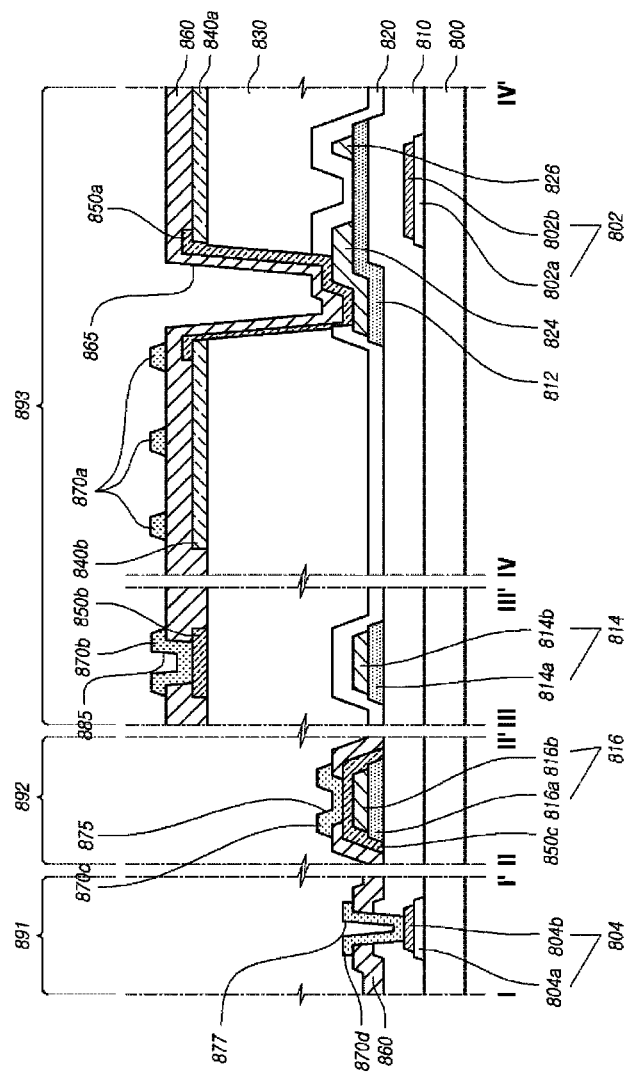

FIG. 13D illustrates a result of removing the photoresist after the dry etching is performed. In FIG. 13D, a first contact hole 865, a second contact hole 885, a third contact hole 875 and a fourth contact hole 877 are formed. Then, second electrodes 870a and 870b, a gate pad connection portion 870d, and a data pad connection portion 870c are formed by using one mask (the fourth photomask), as illustrated in FIG. 13E. The second electrodes 870a and 870b serve as common electrodes, and the second electrode

870b from among the second electrodes 870a and 870b may supply a touch driving signal.

Figure 14:
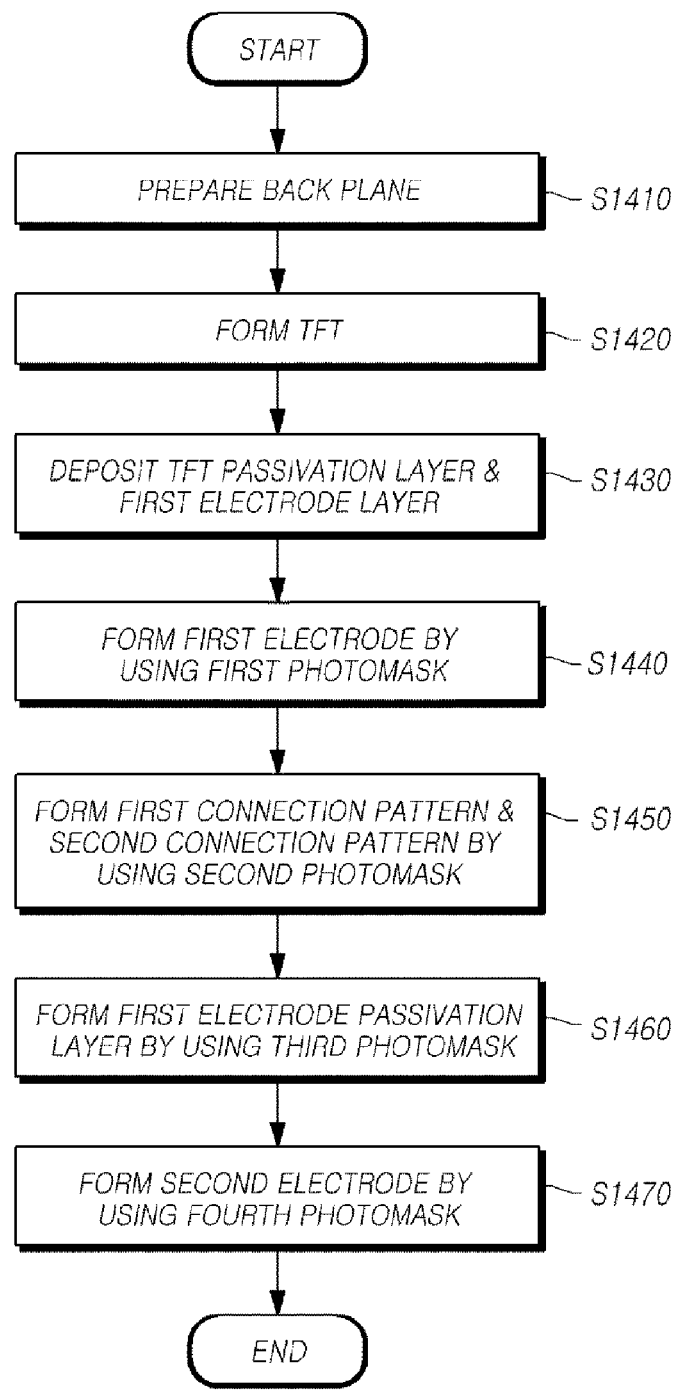
FIG. 14 is a flowchart illustrating process steps according to an embodiment of the present invention.

FIG. 14 is a flowchart illustrating process steps according to an embodiment of the present invention. The process steps illustrated in FIGS. 10 to 13E may be summarized as illustrated in FIG. 14.

In step S1410, a backplane is prepared on which a TFT is to be formed. In step S1420, a TFT is formed on the prepared backplane. In step S1430, a TFT passivation layer, which covers the TFT, and a first electrode layer are stacked. In step S1440, a first electrode is formed by etching the first electrode layer and the TFT passivation layer by using a first photomask. Steps S1410 to S1440 have been described with reference to FIGS. 11A to 11D.

In step S1450, a second photomask is used to form a first connection pattern, which connects one of a source electrode or a drain electrode to the first electrode, and a second connection pattern which supplies a touch driving signal to a second electrode. Step S1450 has been described with reference to FIG. 13A.

Then, a first electrode passivation layer is formed as illustrated in FIGS. 13B to 13D, and a relevant first electrode passivation layer is formed by using a third photomask in step S1460.

In step S1470, the second electrode is formed by using a fourth photomask, as illustrated in FIG. 13E.

A third connection pattern, which is connected to a data pad connection portion, may be formed in step S1450 of forming the first connection pattern and the second connection pattern. In step S1470 of forming the second electrode, the data pad connection portion and a gate pad connection portion may be formed simultaneously with forming the second electrode by using a material identical to that of the second electrode. This configuration has been described with reference to FIG. 13E.

Thus far, an active layer of a TFT formed of amorphous silicon is described. Even when the active layer of the TFT is formed of a metal-oxide semiconductor or poly-silicon (e.g., LTPS), a connection pattern may be implemented which connects a pixel electrode to a source electrode or a drain electrode. Process steps 625 in FIG. 6B of the process, in which an active layer of a TFT is formed of a metal semiconductor, may be applied together with process 690 according to an embodiment of the present invention. Similarly, process steps 635 in FIG. 6B of the LTPS process may be applied together with process 690 according to an embodiment of the present invention.

Figure 15:
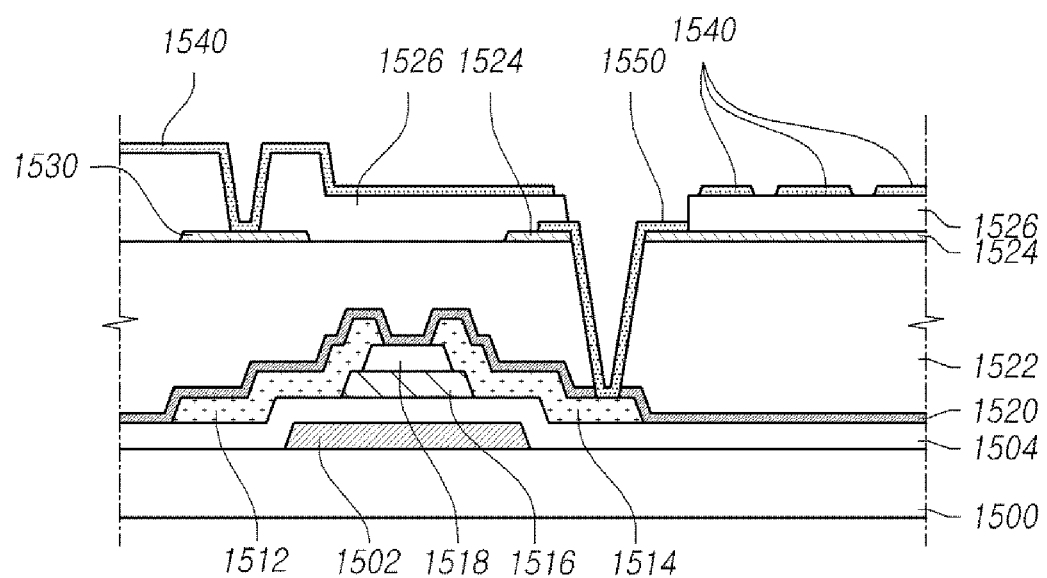
FIG. 15 is a cross-sectional view illustrating an example where an active layer of a thin film transistor is formed of a metal-oxide semiconductor according to an embodiment of the present invention.

FIG. 15 is a cross-sectional view illustrating an example where an active layer of a thin film transistor is formed of a metal-oxide semiconductor. In particular, FIG. 15 is a cross-sectional view illustrating a connection pattern between a pixel electrode and a source electrode or a drain electrode in a case to which the process indicated by reference numeral 690 is applied.

Referring to FIG. 15, formed are a backplane 1500, a gate 1502, a gate insulating film 1504, a source electrode 1512, a drain electrode 1514, an active layer 1516, an etching stopper layer 1518, a first passivation layer 1520, a TFT passivation layer 1522, a pixel electrode 1524 which is an example of a first electrode, a first electrode passivation layer 1526, a second connection pattern 1530 for connecting a touch signal line to a common electrode 1540 which is an example of a second electrode, and the common electrode 1540. Also, a first connection pattern 1550 is formed which connects the pixel electrode 1524 to the drain electrode 1514. The first connection pattern 1550 and the second connection pattern 1530 may be formed of an identical material in one process step.

Figure 16:
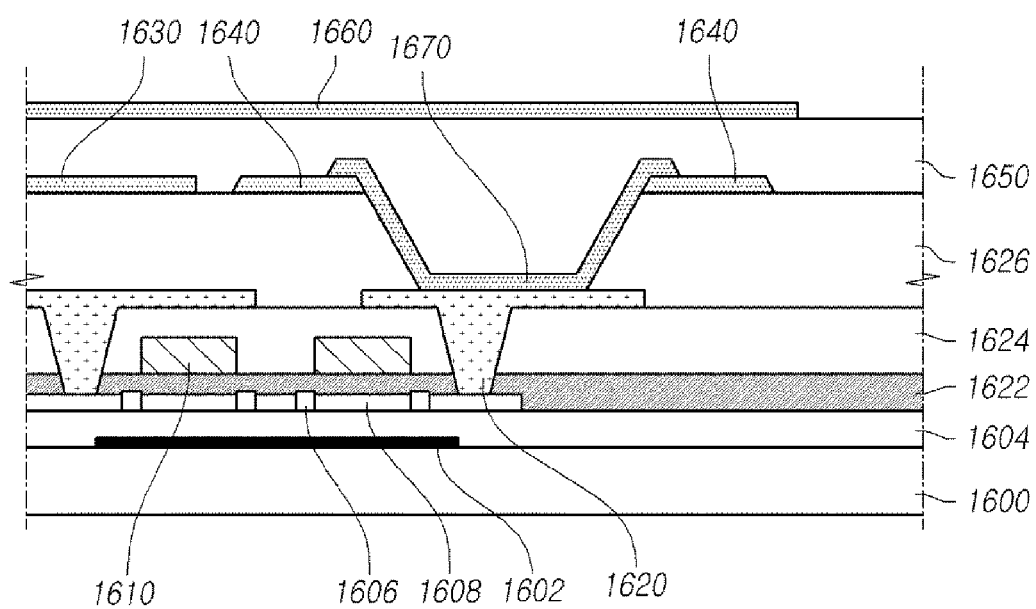
FIG. 16 is a cross-sectional view illustrating an example where an active layer of a thin film transistor is formed of low temperature poly-silicon according to an embodiment of the present invention.

FIG. 16 is a cross-sectional view illustrating an example where an active layer of a thin film transistor is formed of low temperature poly-silicon. In particular, FIG. 16 is a cross-sectional view illustrating a connection pattern between a pixel electrode and a source electrode or a drain electrode in a case to which the process as indicated by reference numeral 690 in FIG. 6B is applied.

In case of LTPS, formed are a backplane 1600, a light shield 1602, a buffer layer 1604, a Lightly-Doped Drain (LDD) 1606, an active layer 1608, a gate electrode 1610, a data electrode (source/drain) 1620, a gate insulating film 1622, an interlayer insulating film 1624, a TFT passivation layer 1626, a touch signal line 1630 for a touch driving signal, a pixel electrode 1640 which is an example of a first electrode, a first electrode passivation layer 1650, a common 1660 which is an example of a second electrode, and a first connection pattern 1670 that connects the pixel electrode 1640 to the data electrode 1620. Here, the touch signal line 1630 and the first connection pattern 1670 may be formed of an identical material in one process step.

The features of the structure and the fabrication method according to an embodiment of the present invention may be applied to a Vcom On Top (VOT) structure including a TFT passivation layer, such as a planarization layer or an overcoat layer. However, the present invention is not limited thereto. Accordingly, the features thereof may also be applied to a Pixel On Top (POT) structure. Specifically, it is possible to ensure compatibility between the POT structure and the VOT structure which is associated with a technique for reducing the number of masks. When the features thereof are applied to the POT structure, in the VOT (or COT) structure, a first electrode, of which an example is a pixel electrode, may be applied to a common electrode, and a second electrode, of which an example is the common electrode, may be applied to the pixel electrode. Also, in the process of forming a touch signal line, the pixel electrode may come into contact with a source/drain through a side contact. In an example of the TFT passivation layer, a material of the TFT passivation layer may be replaced by another organic material having a low permittivity. Examples of the TFT passivation layer may include a planarization layer, which includes a photosensitive material and a non-photosensitive material, and an overcoat layer formed of an organic material.

A process of reducing the number of masks according to an embodiment of the present invention may be applied to all cases where backplanes are made of amorphous silicon, oxide, and LTPS. Also, the process of reducing the number of masks may be applied to a structure including a touch signal line layer.

The structures and the fabrication methods described above according to embodiments of the present invention can reduce the number of masks and the process steps, can improve productivity, and can reduce the cost. Also, the structures and the fabrication methods can reduce the number of masks in forming a first electrode (a pixel electrode) and a TFT passivation layer (a planarization layer or an overcoat layer).

A third connection pattern formed in a process identical to that of forming a first connection pattern and a second connection pattern connects a data pad connection portion to a data line (indicated by reference numeral 816b in FIG. 8)

of a data pad unit. This configuration may be advantageous in reducing or preventing a damage to the data pad unit in a wet etching process.

A description will be made of a process of forming each connection pattern on an LTPS TFT backplane according to still another embodiment of the present invention. In the following description, the feature of simultaneously forming a connection pattern connecting a touch signal line layer to a second electrode (a common electrode) and a connection pattern connecting a first electrode (a pixel electrode) to a source/drain in a process of forming the first electrode will be described.

Figure 17:
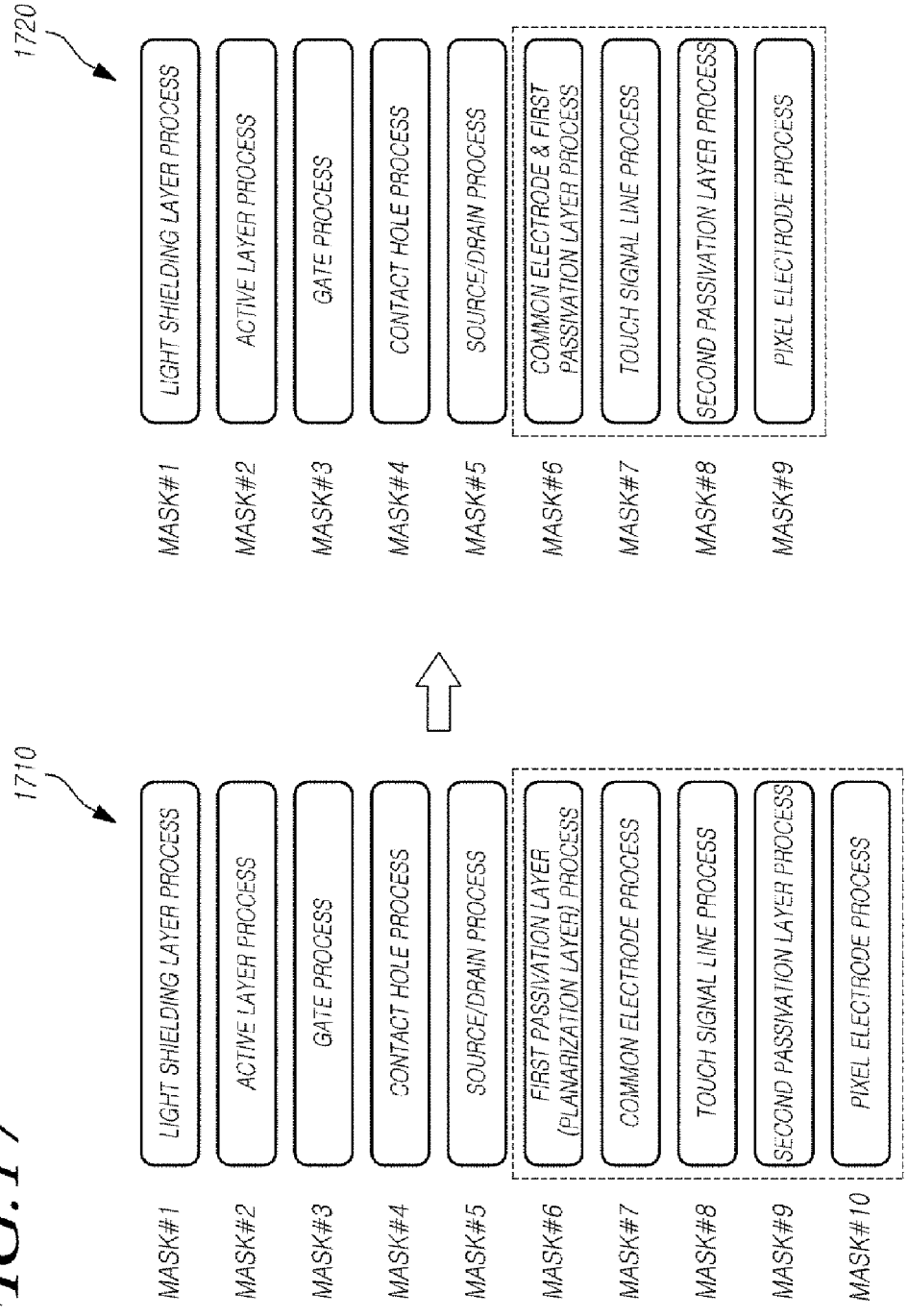
FIG. 17 is a view illustrating a reduction in process steps in case of a Pixel On Top (POT) structure according to an embodiment of the present invention.

FIG. 17 is a view illustrating a reduction in process steps before and after applying an embodiment of the present invention to a Pixel On Top (POT) structure.

Reference numeral 1710 indicates a flow of performing process steps without a connection pattern, and reference numeral 1720 indicates a flow of performing process steps in a case to which a connection pattern of the present invention is applied. In the POT structure, a process indicated by reference numeral 1710 includes a process step of forming a light shield, a process step of forming an active layer, a process step of forming a gate electrode, a process step of forming a contact hole, a process step of forming a source electrode and a drain electrode, a process step of forming a first passivation layer (or a planarization layer), a process step of forming a common electrode, a process step of forming a touch signal line, a process step of forming a second passivation layer (a laminate of one or two passivation layers), and a process step of forming a pixel electrode. In process 1710, 10 masks may be used in the respective process steps.

According to an embodiment of the present invention to which a connection pattern is applied, a process indicated by reference numeral 1720 is identical to process 1710 in performing the process steps by using mask#1 to mask#5. In contrast, in process 1720, a process step of forming a common electrode and a process step of forming a first passivation layer (an overcoat layer) are simultaneously performed. Then, in process 1720, a process step of forming a touch signal line, a process step of forming a second passivation layer (i.e., a lamination of one or two passivation layers), and a process step of forming a pixel electrode which is a first electrode are performed. Accordingly, in process 1720, 9 masks are used, which means the number of masks is reduced by one as compared with that in process 710. Further, according to an embodiment of the present invention, an overcoat layer may be applied instead of a planarization layer, so that the number of masks and the cost can be reduced. These process steps will be described below in more detail.

Figure 18:
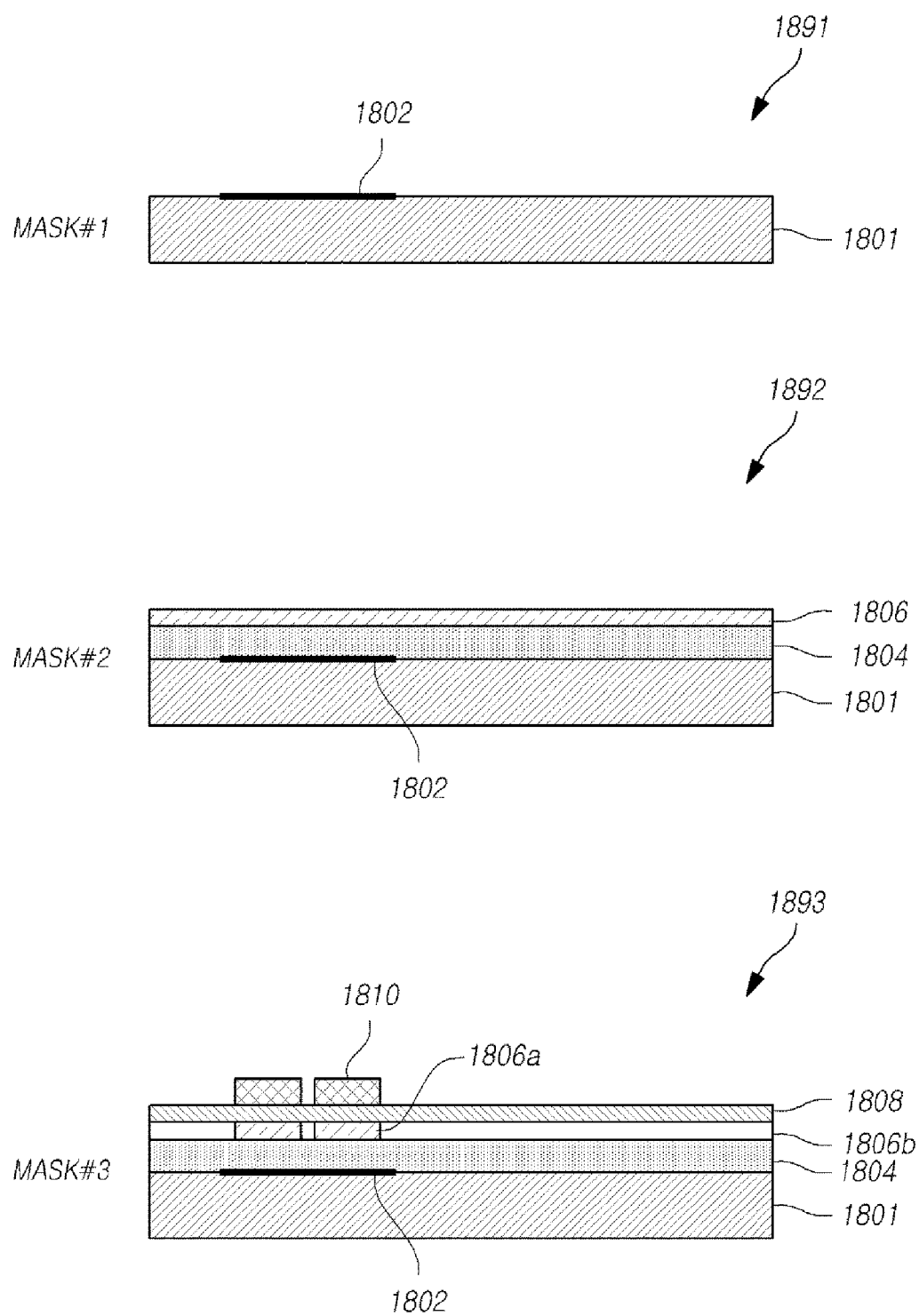
FIG. 18 is cross-sectional views illustrating a process of forming a light shield, an active layer and a gate on a backplane according to an embodiment of the present invention.

FIG. 18 is cross-sectional views illustrating a process of forming a light shield, an active layer and a gate on a backplane according to an embodiment of the present invention.

A light shield 1802 is formed on a backplane 1801 by using mask#1, as indicated by reference numeral 1891, and a buffer layer 1804 is formed on the light shield 1802 and the backplane 1801, as indicated by reference numeral 1892. Then, an active layer 1806 is formed by using mask#2. Then, as indicated by reference numeral 1893, a gate insulator 1808 is formed on the active layer 1806, and a gate 1810 is formed on the gate insulator 1808 by using mask#3. During an etching process, an active layer 1806a located beneath the gate 1810 is not made to serve as a conductor by the gate 1810, but another active layer 180b is made to serve as a conductor. The active layer 180b, which has been made to serve as a conductor, comes into contact with a source electrode and a drain electrode in a subsequent process.

FIG. 19 is cross-sectional views illustrating a process of forming a source electrode and a drain electrode according to an embodiment of the present invention. As indicated by reference numeral 1991, an interlayer insulating film 1815 is formed, and then an etching is performed by using mask#4. In this process, contact holes 1817a and 1817b that expose the active layer 1806b are formed.

Then, as indicated by reference numeral 1992, a source electrode and a drain electrode 1820 are formed by using mask#5. The source electrode and the drain electrode 1820 come into contact with the active layer 1806a through the contact holes 1817a and 1817b.

Figure 20:
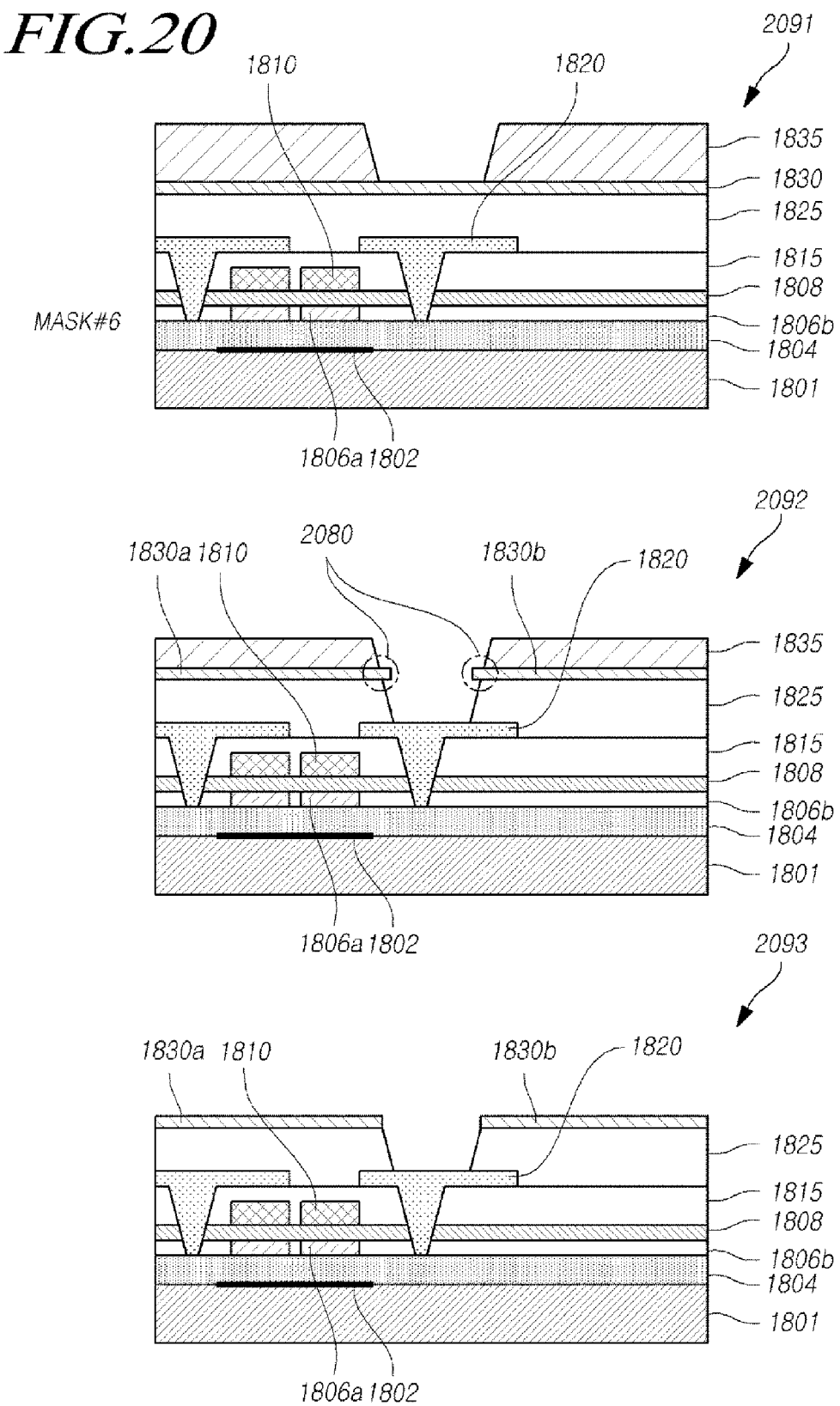
FIG. 20 is cross-sectional views illustrating a process of forming a common electrode of a second electrode and forming an overcoat layer according to an embodiment of the present invention.

FIG. 20 is cross-sectional views illustrating a process of forming a common electrode, which is a second electrode, and forming an overcoat layer according to an embodiment of the present invention.

As indicated by reference numeral 2091, an overcoat layer 1825 and a common electrode layer 1830 are formed, and then a photoresist 1835 is formed by using mask#6. Then, a wet etching is performed on the common electrode layer 1830, and a dry etching is performed on the overcoat layer 1825. As a result, the common electrode layer 1830 is formed as common electrodes 1830a and 1830b, and a part of the photoresist 1835 remains on the common electrodes 1830a and 1830b, as indicated by reference numeral 2092. Also, in the process of performing a dry etching on the overcoat layer 1825 as indicated by reference numeral 2091, the respective common electrodes 1830a and 1830b, which are second electrodes, may be formed so as to have tips of shapes that protrude therefrom, as indicated by reference numeral 2080. Accordingly, in order to remove the protruding tips, a second wet etching is performed on the common electrodes 1830a and 1830b. As a result, as indicated by reference numeral 2093, the part of the photoresist 1835 which remains on the common electrodes 1830a and 1830b is removed, and the tips 2080 are also removed in this process. Referring to FIG. 20, the common electrodes 1830a and 1830b and the overcoat layer 1825 are formed by using one (mask#6), so that the number of masks can be reduced.

Figure 21:
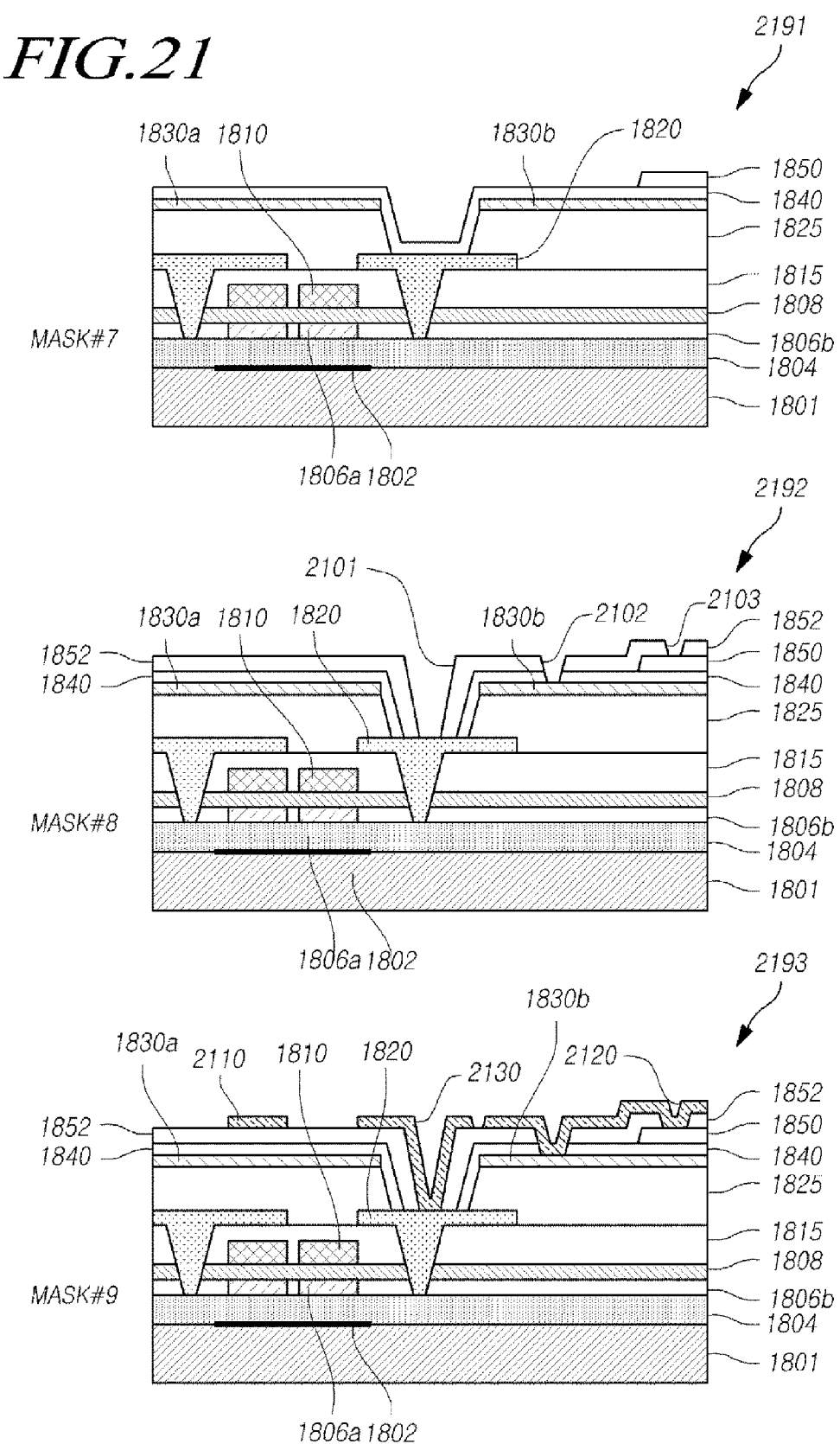
FIG. 21 is cross-sectional views illustrating a process of forming a touch signal line and connecting the touch signal line to a common electrode of a second electrode by using a connection pattern according to an embodiment of the present invention.

FIG. 21 is cross-sectional views illustrating a process of forming a touch signal line and connecting the touch signal line to a common electrode, which is a second electrode, by using a connection pattern according to an embodiment of the present invention.

As indicated by reference numeral 2191, one passivation layer (PAS1) 1840 is formed, and a touch signal line 1850 is formed on the passivation layer (PAS1) 1840 by using mask#7. Then, as indicated by reference numeral 2192, another passivation layer (PAS2) 1852 is formed by using mask#8. In this process, formed are a contact hole 2101 that exposes one 1820 of the source electrode and the drain electrode, a contact hole 2102 that exposes the common electrode 1830b, and a contact hole 2103 that exposes the touch signal line 1850.

Then, as indicated by reference numeral 2193, a pixel electrode 2110 which is a first electrode is formed by using mask#9, and simultaneously, a connection pattern 2120, which connects the common electrode 1830b to the touch signal line 1850, and a connection pattern 2130, which contacts the pixel electrode 2110 and contacts one 1820 of the source electrode and the drain electrode, are formed. The connection pattern 2120, which connects the common electrode 1830b to the touch signal line 1850, is formed on the two contact holes 2102 and 2103 formed as indicated by reference numeral 2192. The connection pattern 2130, which connects the pixel electrode 2110 to one 1820 of the source electrode and the drain electrode, is formed on the contact hole 2102 formed as indicated by reference numeral 2192.

As illustrated in FIGS. 17 to 21, even in the POT structure, to which a planarization layer is applied and in which a pixel electrode of a first electrode is formed after a common electrode of a second electrode, the connection patterns 2120 and 2130 may be formed of a material identical to that of the pixel electrode in the same process. In view of process difficulty of selectively etching only an organic material when performing a dry etching on the organic material, a part of the organic material may remain, or a part of a passivation layer at a lower part may be etched together with the organic material. Meanwhile, a material of the planarization layer may be replaced by another organic material having a low permittivity, examples of which may include a photosensitive material and a non-photosensitive material. The process of reducing the number of masks, according to an embodiment of the present invention, may be applied to all types of backplanes which include a-Si, oxide and LTPS, and may also be applied to a structure including an M3L Layer, which delivers a touch driving signal, and even to the VOT structure to which the planarization layer is applied.

As described with reference to FIGS. 7A to 16, the display device includes, as elements thereof, a gate line that is formed in a first direction on the backplane and delivers a gate signal; a data line that is formed in a second direction on the backplane and delivers a data signal; a TFT that is formed at each pixel defined by a crossing between the gate line and the data line; a first electrode (a pixel electrode) that is formed so as to be spaced apart from one of a source electrode and a drain electrode of the TFT; a second electrode (a common electrode) that is formed on a layer different from that on which the first electrode is formed; a TFT passivation layer that is formed on the TFT and has a first contact hole formed therein; a first connection pattern that connects one of the source electrode and the drain electrode to the first electrode through the first contact hole; and a second connection pattern that delivers a touch driving signal to the second electrode and may be formed of a material identical to that of the first connection pattern.

In the configuration illustrated in FIGS. 17 to 21, the second electrode passivation layers 1840 and 1852 may be formed on the second electrode 1830b, and the first electrode 2110 may be formed on the second electrode passivation layers 1840 and 1852. The TFT passivation layer may include the second electrode passivation layers 1840 and 1852 and the overcoat layer 1825. Also, the first connection pattern 2130, which connects the first contact hole 2101 formed on the TFT passivation layer 1825, 1840 and 1852 to the source electrode or the drain electrode 1820, may be formed of a material identical to that of the first electrode. Further, the second contact hole 2102, which exposes the common electrode 1830b of the second electrode, is formed on the second electrode passivation layers 1840 and 1852. The second connection pattern 2120 formed on the second contact hole 2102 is connected to the touch signal line 1850 formed in the first direction or second direction, and is also connected to the common electrode 1830b, which is the second electrode, through the second contact hole 2102.

Figure 22:
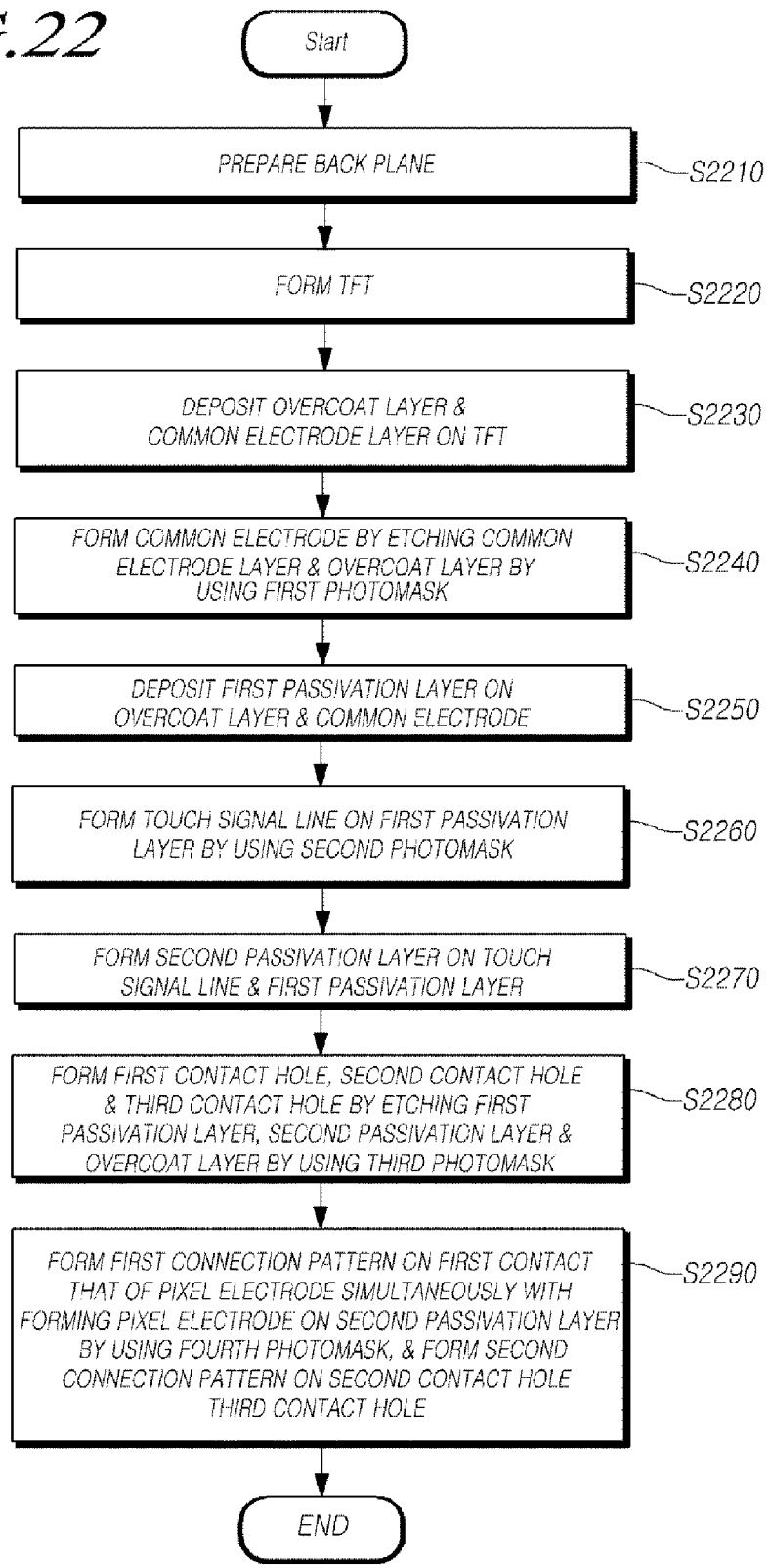
FIG. 22 is a flowchart illustrating a process of fabricating a display device according to an embodiment of the present invention.

FIG. 22 is a flowchart illustrating a process of fabricating a signal line of a display device according to an embodiment of the present invention, and illustrates the process described with reference to FIGS. 18 to 21.

In step S2210, first, a backplane is prepared. In step S2220, a TFT is formed. In step S2230, an overcoat layer and a common electrode layer are stacked on the TFT. In step S2240, a common electrode is formed by etching the common electrode layer and the overcoat layer by using a first photomask. In step S2250, a first passivation layer is stacked on the overcoat layer and the common electrode. In step S2260, a touch signal line is formed on the first passivation layer by using a second photomask. In step S2270, a second passivation layer is formed on the touch signal line and the first passivation layer. In step S2280, a first contact hole that exposes one of a source electrode and a drain electrode of the TFT, a second contact hole that exposes the common electrode, and a third contact hole that exposes the touch signal line are formed by etching the first passivation layer, the second passivation layer and the overcoat layer by using a third photomask. In step S2290, a pixel electrode is formed on the second passivation layer by using a fourth photomask, and simultaneously, a first connection pattern is formed on the first contact hole and a second connection pattern is formed on the second contact hole and the third contact hole, by using a material identical to that of the pixel electrode. Here, the second connection pattern connects the common electrode to the touch signal line.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device having a plurality of pixels comprising:
    a gate line that is provided in a first direction on a backplane and delivers a gate signal;
    a data line that is provided in a second direction on the backplane and delivers a data signal;
    a Thin Film Transistor (TFT) in each pixel defined by a crossing between the gate line and the data line;
    a first electrode spaced apart from one of a source electrode and a drain electrode of the TFT;
    a second electrode that is provided on a layer different from that on which the first electrode is provided, wherein the second electrode is above the first electrode in each pixel;
    a TFT passivation layer that is provided on the TFT and has a first contact hole;
    a first connection pattern that connects one of the source electrode and the drain electrode to the first electrode through the first contact hole; and
    a second connection pattern that delivers a touch driving signal to the second electrode and is formed of a material substantially identical to that of the first connection pattern,
    wherein the first connection pattern and the second connection pattern are simultaneously formed using a mask.

2. The display device of claim 1, further comprising a first electrode passivation layer on the first electrode, and wherein the second electrode is provided on the first electrode passivation layer.

3. The display device of claim 2, wherein the second connection pattern is connected to a touch signal line provided in the first direction or the second direction, and is connected to the second electrode through a second contact hole provided on the first electrode passivation layer.

4. The display device of claim 1, further comprising a second electrode passivation layer on the second electrode, and wherein the first electrode is provided on the second electrode passivation layer.

5. The display device of claim 4, wherein the second electrode passivation layer further comprises a second contact hole that exposes a part of the second electrode, the second connection pattern is connected to a touch signal line provided in the first direction or the second direction, and the second connection pattern is connected to the second electrode through the second contact hole.

6. The display device of claim 1, wherein the first connection pattern is provided on the first electrode in such a manner that a partial region of the first connection pattern overlaps a surface of the first electrode.

7. The display device of claim 1, wherein the first connection pattern is provided on a lower surface of the first electrode in such a manner that a partial region of the first connection pattern overlaps the lower surface of the first electrode.

8. The display device of claim 1, wherein the display device further comprises a third connection pattern on a lower surface of a data pad connection portion, and the third connection pattern is formed of a material substantially identical to that of the first connection pattern and the second connection pattern.

9. The display device of claim 1, wherein the second electrode serves as a common electrode to which a common voltage is applied when the display device operates in a display driving mode, and serves as a touch electrode to which a touch driving signal when the display device operates in a touch driving mode.

10. A display device having a plurality of pixels comprising:
   a display panel including:
      a Thin Film Transistor (TFT) that is provided in each of an N×P number of pixels defined by crossings between gate lines that are provided in a first direction on a backplane and deliver gate signals, and data lines that are provided in a second direction on the backplane and deliver data signals,
      an N×P number of first electrodes, each of which is provided so as to be spaced apart from one of a source electrode and a drain electrode of the TFT,
      the P number of second electrodes, each of which is provided so as to correspond to the first electrode and which provide an identical signal to all of the N number of pixels, wherein each second electrode is above each corresponding first electrode in each pixel,
      a TFT passivation layer that is provided on the TFT and has a first contact hole; the N×P number of first connection patterns which are provided on the N×P number of TFTs and each of which connects the first electrode to one of the source electrode or the drain electrode through the first contact hole, and
      the P number of second connection patterns that deliver a touch driving signal to the P number of second electrodes and are formed of a material substantially identical to that of the first connection patterns;
   a touch integrated circuit that applies a touch driving signal to all or some of the P number of second electrodes when a driving mode of the display panel is a touch driving mode;
   a data driver that supplies data voltages to the data lines when the driving mode is a display driving mode; and
   a gate driver that sequentially supplies scan signals to the gate lines when the driving mode is the display driving mode,
   wherein the first connection pattern and the second connection pattern are simultaneously formed using a mask.

11. The display device of claim 10, further comprising a first electrode passivation layer on the first electrode, and wherein the second electrode is provided on the first electrode passivation layer.

12. The display device of claim 10, further comprising a second electrode passivation layer on the second electrode, and wherein the first electrode is provided on the second electrode passivation layer.

13. The display device of claim 12, wherein the second electrode passivation layer further comprises a second contact hole that exposes a part of the second electrode, the second connection pattern is connected to a touch signal line provided in the first direction or the second direction, and the second connection pattern is connected to the second electrode through the second contact hole.

14. The display device of claim 10, wherein the second connection pattern is connected to a touch signal line provided in the first direction or the second direction, and is connected to the second electrode through a second contact hole formed in the first electrode passivation layer.

15. The display device of claim 10, wherein the display device further comprises a third connection pattern on a lower surface of a data pad connection portion, and the third connection pattern is formed of a material substantially identical to that of the first connection pattern and the second connection pattern.

16. The display device of claim 10, wherein the second electrode serves as a common electrode to which a common voltage is applied when the display device operates in a display driving mode, and serves as a touch electrode to which a touch driving signal is applied when the display device operates in a touch driving mode.

* * * * *